(12) United States Patent
Hoffmeyer et al.

(10) Patent No.: US 12,439,542 B2
(45) Date of Patent: Oct. 7, 2025

(54) STANDOFF AND SUPPORT STRUCTURES FOR RELIABLE LAND GRID ARRAY AND HYBRID LAND GRID ARRAY INTERCONNECTS

(71) Applicant: INTERNATIONAL BUSINESS MACHINES CORPORATION, Armonk, NY (US)

(72) Inventors: Mark K. Hoffmeyer, Rochester, MN (US); Sarah K. Czaplewski-Campbell, Rochester, MN (US); Brian Beaman, Cary, NC (US); Yuet-Ying Yu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 533 days.

(21) Appl. No.: 17/853,249

(22) Filed: Jun. 29, 2022

(65) Prior Publication Data
US 2024/0008208 A1    Jan. 4, 2024

(51) Int. Cl.
*H05K 7/10*     (2006.01)
*H01L 21/48*    (2006.01)
(Continued)

(52) U.S. Cl.
CPC ....... *H05K 7/1069* (2013.01); *H01L 21/4853* (2013.01); *H01R 12/57* (2013.01);
(Continued)

(58) Field of Classification Search
CPC ...... H05K 7/1069; H05K 7/10; H05K 7/1053; H05K 7/1061; H01L 21/4853;
(Continued)

(56) References Cited

U.S. PATENT DOCUMENTS 5,220,488 A    6/1993   Denes
5,991,165 A    11/1999  Jones, Jr.
(Continued)

FOREIGN PATENT DOCUMENTS

CN    2648629 Y    10/2004
CN    102544825 A    7/2012
JP    H0669619 A  *  3/1994

OTHER PUBLICATIONS

International Search Report and Written Opinion, Date of mailing Sep. 21, 2023, Application No. PCTCN2023/103098, 10 pages.

*Primary Examiner* — Justin M Kratt
(74) *Attorney, Agent, or Firm* — James L. Olsen

(57) ABSTRACT

Disclosed herein is a method for producing a land grid array (LGA) socket connector assembly and the resultant assembly. The method comprises providing a carrier having a first carrier thickness with an array of vias, each having a first diameter, providing pockets around top surfaces of the vias, each having a second diameter and creating a portion of the pockets having a second carrier thickness that is less than the first carrier thickness, providing socket contact springs, each comprising a hole support structure that supports the socket contact spring within the via, and a contact beam configured to contact a conductor of an integrated circuit to be placed within the socket connector assembly, wherein a portion of carrier having a first carrier thickness is configured to prevent the contact beam from inelastically deforming when bent under load. Alternately, a contact feature may be used to prevent the inelastic deformation.

20 Claims, 15 Drawing Sheets

(51) Int. Cl.
*H01R 12/57* (2011.01)
*H01R 13/24* (2006.01)
*H01R 43/20* (2006.01)
*H01R 12/71* (2011.01)

(52) U.S. Cl.
CPC ..... *H01R 13/2442* (2013.01); *H01R 13/2485* (2013.01); *H01R 43/20* (2013.01); *H01L 21/4814* (2013.01); *H01L 21/4846* (2013.01); *H01L 21/486* (2013.01); *H01L 2924/15313* (2013.01); *H01R 12/714* (2013.01); *H01R 13/24* (2013.01); *H01R 13/245* (2013.01); *H01R 13/2478* (2013.01); *H05K 7/10* (2013.01); *H05K 7/1053* (2013.01); *H05K 7/1061* (2013.01)

(58) Field of Classification Search
CPC ............. H01L 21/4814; H01L 21/4846; H01L 21/486; H01L 2924/15313; H01R 12/57; H01R 13/2442; H01R 13/2485; H01R 43/20; H01R 12/714; H01R 13/24; H01R 13/245; H01R 13/2478
See application file for complete search history.

(56) References Cited

U.S. PATENT DOCUMENTS

| | | |
|---|---|---|
| 6,708,871 B2 | 3/2004 | Pierson |
| 6,822,609 B2 | 11/2004 | Mendolia |
| 7,448,877 B1 | 11/2008 | Pennypacker |
| 7,556,522 B2 | 7/2009 | Ma |
| 7,819,693 B2 | 10/2010 | Polnyi |
| 7,922,548 B2 | 4/2011 | Fan |
| 7,944,698 B2 | 5/2011 | Colbert |
| 8,292,649 B2 | 10/2012 | Yeh |
| 10,128,593 B1 | 11/2018 | Hejase |
| 2002/0182901 A1 | 12/2002 | Koopman |
| 2004/0051169 A1* | 3/2004 | Chen ................... H01L 24/86 257/684 |
| 2005/0042851 A1 | 2/2005 | Wen |
| 2006/0046527 A1 | 3/2006 | Stone |
| 2009/0061701 A1* | 3/2009 | McAlonis .......... H01R 13/2442 439/862 |
| 2010/0093190 A1* | 4/2010 | Miwa .................... H01R 12/57 439/65 |
| 2012/0156899 A1 | 6/2012 | Jeon |
| 2017/0203515 A1* | 7/2017 | Bennett ................ B29C 64/393 |
| 2020/0205300 A1* | 6/2020 | Wu ...................... H01L 21/4857 |
| 2022/0352118 A1* | 11/2022 | Harumoto .......... H01L 25/0753 |

* cited by examiner

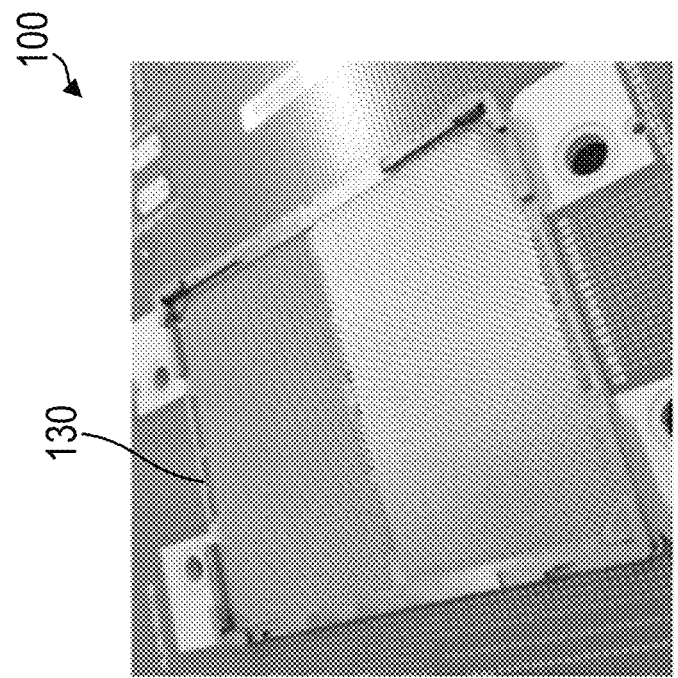
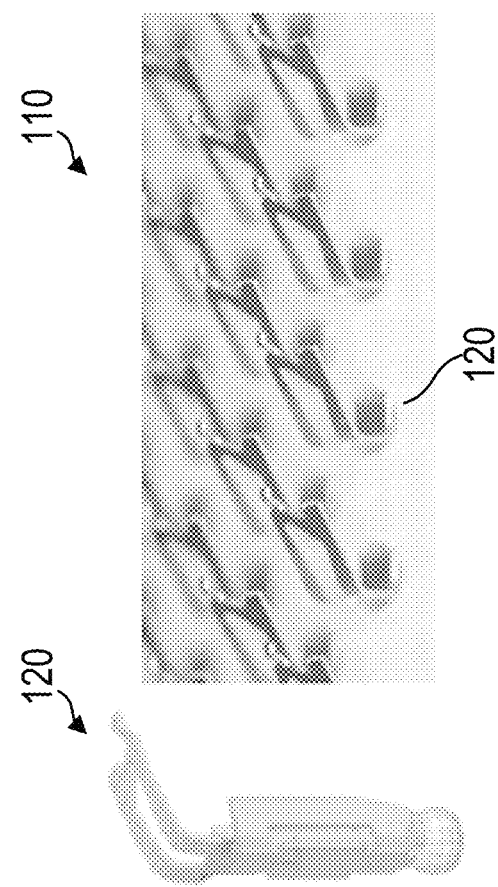
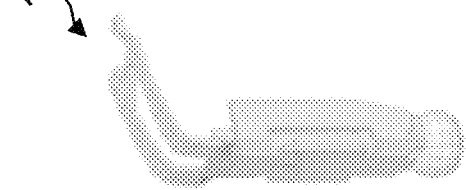
FIG. 1A
FIG. 1B
FIG. 1C

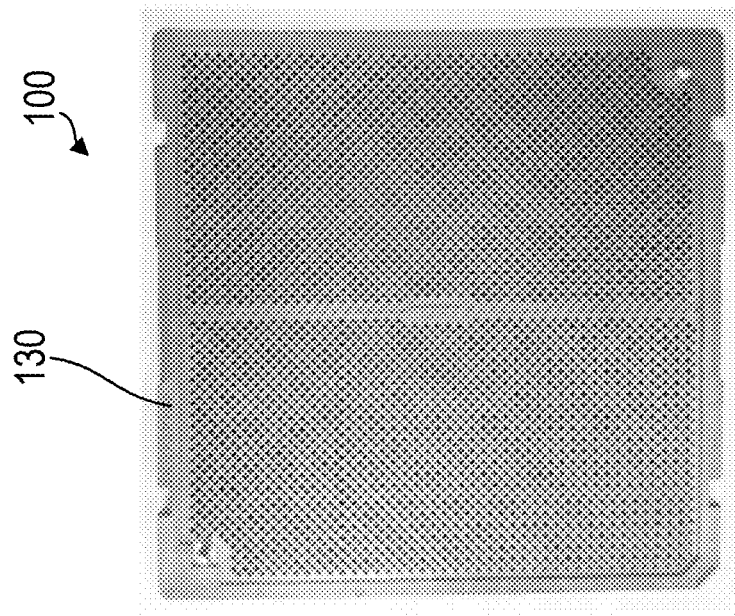
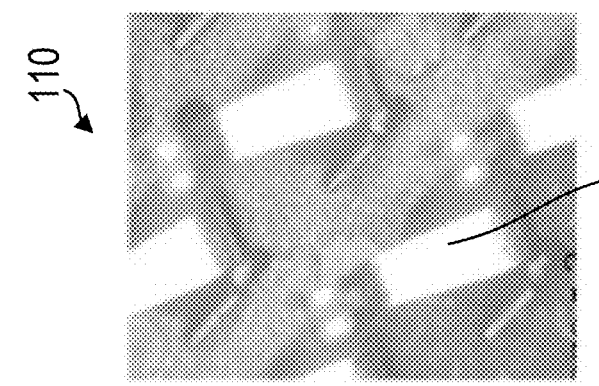
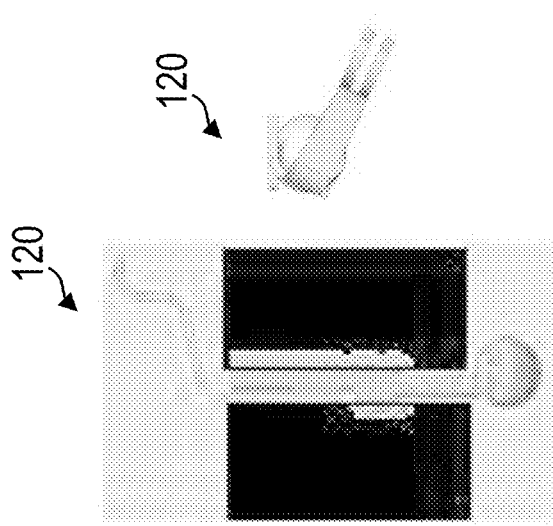
FIG. 2A  FIG. 2B  FIG. 2C  FIG. 2D

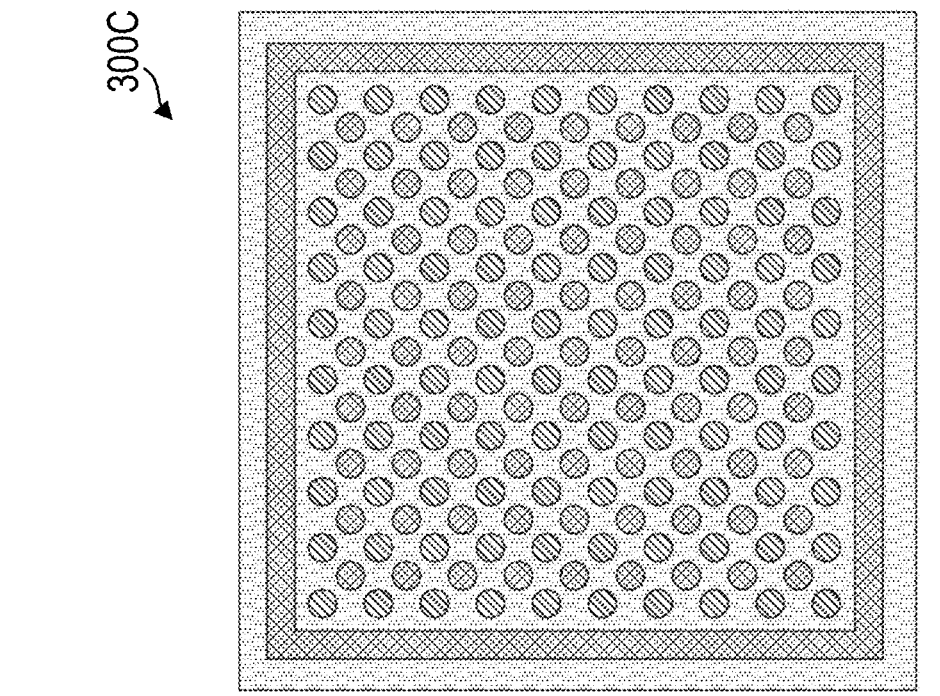
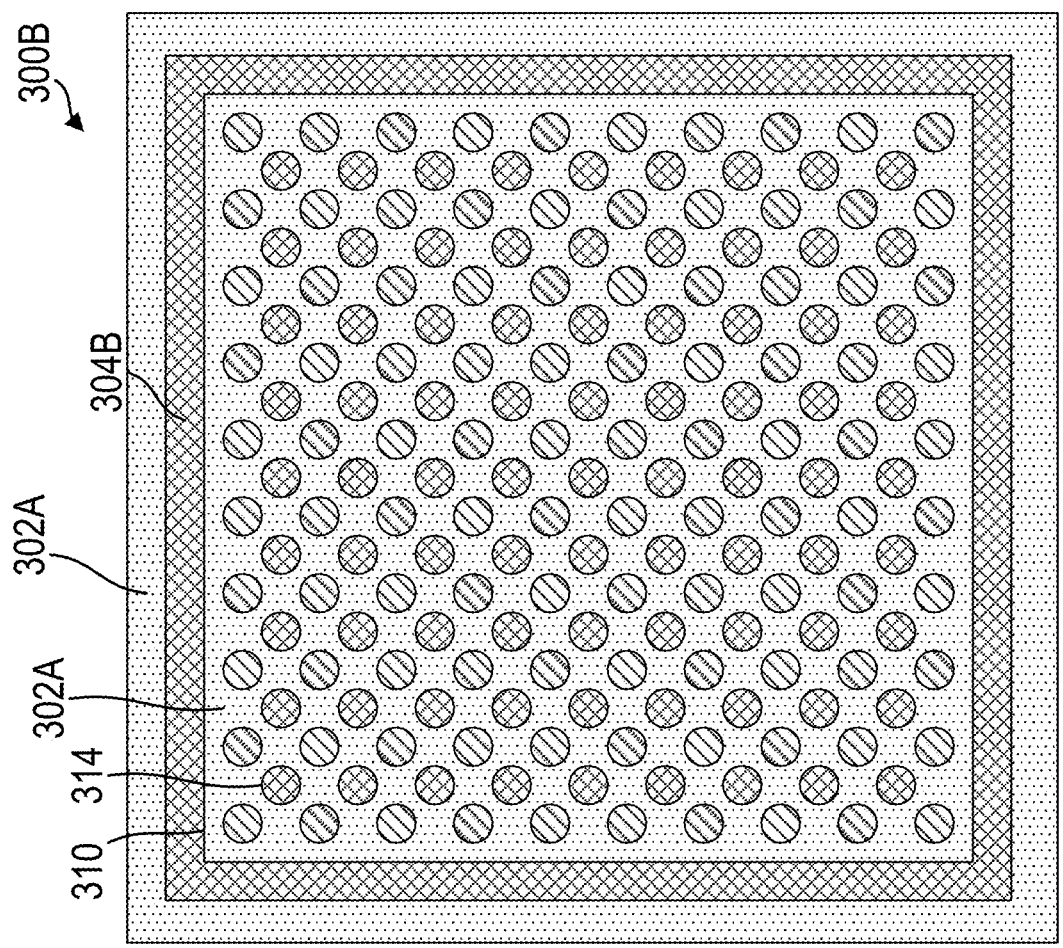
FIG. 3C
FIG. 3B

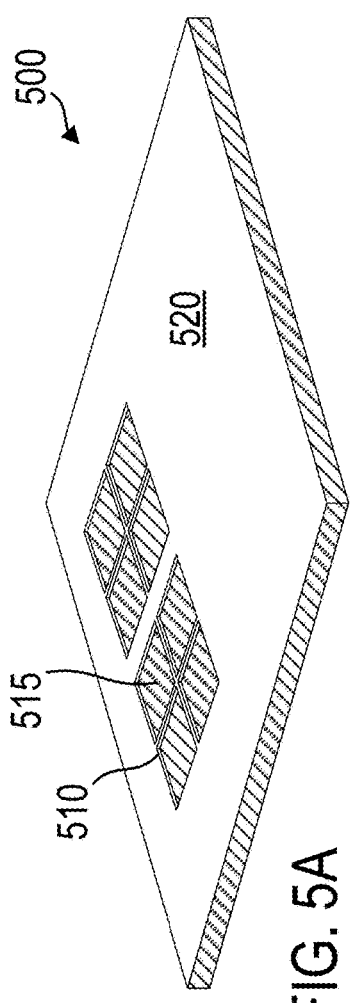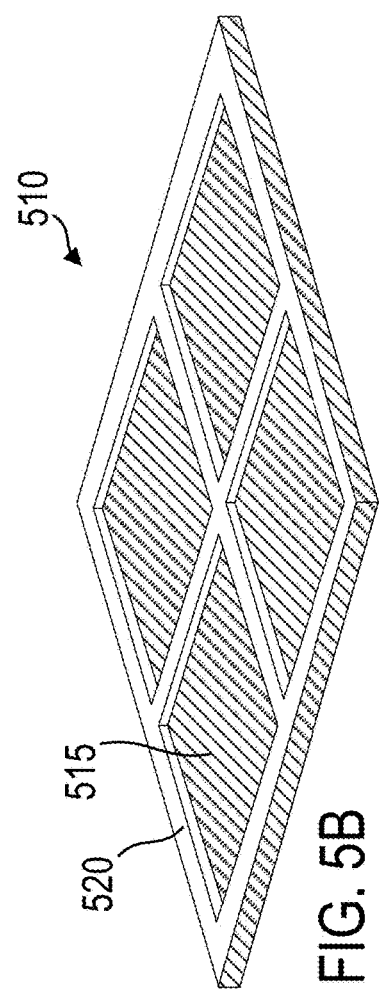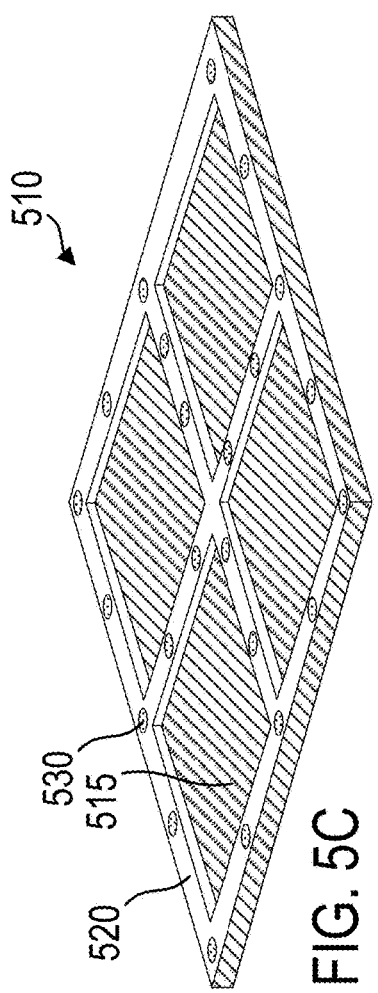

STANDOFF AND SUPPORT STRUCTURES FOR RELIABLE LAND GRID ARRAY AND HYBRID LAND GRID ARRAY INTERCONNECTS

BACKGROUND

Disclosed herein is a standoff structure and support structure for reliable land grid array and hybrid land grid array interconnects and related method of manufacture. The following acronyms may be used below:

TABLE 1

| Application-Specific Acronyms | |
|---|---|
| BGA | ball grid array |
| BSM | bottom surface metallurgy |
| DCM | Dual Chip Module |
| EMC | electromagnetic compatibility |
| HiP | head-in-pillow |
| HLGA | hybrid land grid array |
| IC | integrated circuit, integrated circuit chip |
| I/O | input/output |
| LCP | liquid crystal polymer |
| LGA | land grid array |
| MCM | multi-chip module |
| PC | printed circuit |
| PCB | printed circuit board |
| PTH | plated thru hole |
| PWB | printed wiring board |
| SCM | single-chip module |
| SMT | surface mount technology |
| SI | signal integrity |

As electronic technology evolved into using smaller and smaller components, new methods of mounting those smaller components onto printed circuit (PC) boards (PCBs) evolved as well. In some instances, integrated circuits (ICs) plug into a socket on a PCB. One of these methods of mounting is the land grid array (LGA). The LGA is a type of surface-mount packaging for ICs, including single chip (SCM), dual chip (DCM), and multi-chip (MCM) module configurations. The IC or module has an array of electrical terminations present as bottom surface metallurgy (BSM) LGA pads (lands) on its underside that are connected to the PCB with corresponding LGA pads by a socket that possesses an array of contact springs within it. The socket is positioned and mounted to the PCB and the module is then mounted into it followed by an application of mechanical load to the module-socket-board assembly to properly actuate the contact springs and provide a robust, reliable assembly. A hybrid LGA socket (HLGA) may also be used to create surface mount technology (SMT) solder connections between the PCB and socket that holds the module. In this configuration, the HLGA socket has solder balls attached to the bottom face of the array of contact springs in the socket housing. After soldering the socket to the board, the LGA module is mounted into the socket and a mechanical load is applied to make robust contact with the array of interconnect springs.

In various LGA applications, not all contact pads ("lands") or rows or columns of pads on the underside of a LGA module package need to be used. Grid elements (lands or pads) can be, e.g., circular, triangular, or have other polygonal shapes—and may even have different sizes. Grids of pads (lands) may sometimes appear like honeycomb patterns, where designs are typically optimized for factors like contact spacing, coplanarity, and electrical gap to neighboring contacts (including tolerance considerations). This optimization of design variables is critical to ensure adequate electrical signal integrity, and to provide the best shape profiles of the hardware such that socket contact springs provide adequate normal force to ensure reliable electrical interconnections to the socket and PCB backplane.

LGA packaging is also related to ball grid array (BGA) packaging. For a BGA package, solder balls are typically attached to the lands of an LGA package to create an SMT package configuration that is suitable for direct soldering to a PCB. Although LGA packages are usually designed to fit into a socket, in some cases LGA packages without solder balls attached may also be direct soldered to the PCB using an application of solder paste or other suitable solder application.

Sockets used for LGA or HLGA attachment of modules to PCBs also possess several structural features to ensure proper module alignment, and mechanical support of the module within the socket housing, and to ensure contact springs remain properly actuated (deflected) under load to provide reliable function. These structural features may consist of one or more module alignment frame elements and one or more module and/or socket and contact support features called standoffs and downstops. A downstop is a feature on an LGA connector to provide module support and to limit contact deflection. On an HLGA connector, the term downstop is applicable to the spring contact or top face of the connector that mounts the module. Standoff is a term used primarily for HLGA connectors on the BGA connection side where the standoff features limit creep of the solder ball connections when under load in the application. FIG. 11B, discussed below, illustrates an example of a downstop 694 and a standoff 696 feature.

Standoffs and downstops within an LGA or hybrid land grid array (HLGA) socket connector used to connect a module to a circuit board are raised features on the socket housing and provide several functions to ensure high yield, robust assembly and long-term interconnect reliability. On the module connection face of an LGA socket, standoff features provide a seating plane for a module after it is inserted and load is applied to the board-socket-module-heat removal device stack. Standoffs on the module connection face of the socket also provide multiple surfaces of module contact that limit the downward travel of the socket contact springs to prevent contact over-deflection and contact damage during shock events and long-term operation resulting from creep. For an LGA connector, standoffs provide similar function to the board surface. For an HLGA connector with solder balls used to for reflow attachment to a board, standoff features of the solder ball face of the connector housing ensure long term reliability of the solder joints by limiting long term solder creep.

Recent development work on new socket technology needed for modern systems shows a lack of adequate standoff features to ensure reliable socket function for new applications. Available area for creation of internal downstop features and size of features is significantly reduced, and features do not form properly using traditional molding of highly filled liquid crystal polymer (LCP).

Inadequate presence of local standoff features may result in significant socket contact damage during shipping and shipping tests of various sockets, and a lack of custom, local standoff features may cause significant long term reliability issues from contact over deflection in the presence of module laminate creep which may be significant on bare die SCMs, DCMs, and MCMs required for use in systems where these sockets are used. In addition, for certain other sockets, there is a similar need to create custom downstops using alternate methods to support densely packed spine control and processor tap chips mounted atop the module. These issues are expected to expand given continual module size increases and power increases needed to support future systems, especially when coupled with current limitations socket suppliers have in making large sockets with local standoff features.

In one existing design, a molded LCP housing technology is used where some standoff features can be molded into the housing perimeter and centerline to seat the module. However, given the complexity and size of new modules for new connector technology, space for local molded in stand-off features to inhibit contact over-deflection is limited, and these features do not mold in properly, if at all, due to material flow limitations.

In another existing design, a printed wiring board (PWB) material for the socket housing is used which currently supports only a secondary attachment of molded plastic perimeter and centerline standoff features, leaving both existing designs with similar reliability risks and limitations.

In various embodiments, standoff and downstop features may be created using new methods that can be used separately or in combination to provide local and perimeter support as needed on new, large, complex socket designs that have limited interior space to be made using traditional (i.e., molding) methods.

FIGS. 1A-1C and FIGS. 2A-2D are pictorial diagrams illustrating HLGA connectors as typically used sockets 100 for CPU modules. FIG. 1A is a pictorial diagram illustrating an example of a single contact of the array of contacts shown in FIG. 1B and HLGA socket shown in FIG. 1C. FIG. 1B is a pictorial diagram illustrating an example of an array of contacts shown in FIG. 1A integrated into a socket contact carrier housing. FIG. 1C is a pictorial diagram illustrating an HLGA socket made with a laminate contact carrier housing, including integrated contacts and integrated molded plastic module alignment frame and support features. The example HLGA socket 100 (FIG. 1C) is made with a laminate substrate housing. HLGA contacts FIG. 1A 120 are inserted into the laminate substrate housing. Alignment and standoff features are made from molded LCP heat staked into the substrate housing. LGA and HLGA connectors have multiple spring contact arrays 110 formed by a plurality of LGA/HLGA contacts 120, as shown by way of example in FIG. 1B that are commonly mounted into housings 130 made from printed circuit board laminate materials. These housings 130 also have added module-alignment features and packaging-support features that are either molded directly into the housings 130 or are added to the housings 130 as separate features by using heat-staking operations or by adhesively affixing the features to housing 130 surfaces.

FIGS. 2A-2D, show examples of these general socket features for LGA contacts 120, and arrays of spring contacts 110 incorporated within a socket housing 130 molded from LCP that also includes alignment and support features integrated into the housing mold. FIG. 2A is a pictorial diagram illustrating an example of a cross section of an LCP (liquid crystal polymer) connector housing with a single HLGA contact mounted in it. FIG. 2B is a top-down view on the contact depicted in FIG. 2A. FIG. 2C is a pictorial diagram illustrating contacts shown in FIG. 2A and FIG. 2B a mounted in a molded LCP plastic housing. FIG. 2D is a pictorial diagram illustrating an HLGA socket made with an LCP plastic housing with molded in LCP module alignment frame and support features. For sockets shown in FIGS. 1A-2D, these alignment and support features provide multiple critical functions for the interconnection between module and printed wiring board (PWB) surfaces.

For example, in addition to providing alignment of module-to-socket contacts, alignment features added to, or molded into the top surface of the housing 130 also include a keying geometry to ensure modules are plugged into sockets in the correct orientation to avoid damage or electrical shorts. In addition, current designs preferably add support features to both top and bottom faces of socket housings to provide and ensure proper contact loading and overall packaging reliability and robustness. Specifically, topside (module-side) features provide a controlled module standoff height from the surface of the socket housing to ensure proper and uniform beam deflection of LGA/HLGA contacts 120, shown by way of example in FIG. 1C and FIG. 2D.

These standoff features are also designed to press against the surface of the module at full intended interconnect contact 120 deflection. By using additional load in the design, these standoffs also take on and distribute the additional load and provide additional seating friction on the module surface that ensures robustness against gross module movement or excess contact micromotion that can cause contact wear during shock or vibration events in the system during shipping, installation, or operation.

Standoffs added to the backside of the LGA/HLGA socket housings 120 (on the printed wiring board (PWB) side) provide multiple functions to ensure reliability as well. For true LGA contacts 120, these standoffs provide similar function to top surface standoffs by controlling both the amount of contact-beam deflection and frictional seating to the PWB when additional load is applied. For HLGA sockets 100, bottom surface standoffs also provide critical load distribution to limit and prevent excess solder ball creep and high strain development on solder ball connections that can lead to damage and creep-driven early life failures, including ball-collapse-driven shorts or SI-driven failures resulting from creepage and clearance issues between adjacent signals.

As LGA and HLGA modules continue to grow in both size and complexity, top and bottom surface standoff features become increasingly important on LGA/HLGA sockets and are increasingly difficult to implement without impacting the desired size of the module packaging. Specifically, the addition of these alignment and standoff features using typical methods limits the designers' ability to keep module size at a minimum for a given input/output (I/O) requirement.

In general, large processor modules of several types are designed with sectors or quadrants to manage directional LGA plug forces. These sectors typically run down module centerlines and must be supported under load with in situ connector standoffs to ensure module reliability, while perimeter alignment features must also provide similar standoff and highly accurate alignment.

In addition, molded-in interstitial standoffs that can be added to some connector housings in existing high-performance microprocessor system designs are at critical minimum dimension tolerance when using one millimeter (mm) pitch LGA contact technology.

Also, laminate housings that must use standoffs attached via secondary methods are also at tolerance limits with respect to current design needs. These housings must be selectively located to avoid issues with contact insertions, while the addition of secondary interstitial standoffs is at present not possible using traditional molding and heat-staking processes.

Finally, the addition of molded-in standoffs or traditional heat-staked standoffs added with secondary operations can significantly alter the dynamic warp properties of HLGA sockets during reflow operations, sometimes negatively influencing board shape for module attachment to enable good load distribution on contacts and low strain on solder joints. In extreme instances, this dynamic warp behavior leads to highly warped HLGA site areas and can drive solder joint issues, including formation of head-in-pillow (HiP) defects or pad cratering upon module installation and load application during contact engagement.

SUMMARY

Disclosed herein is a method for producing a land grid array (LGA) socket connector assembly. The method comprises providing a carrier having a first carrier thickness with an array of vias, each having a first diameter, providing pockets around top surfaces of the vias, each having a second diameter and creating a portion of the pockets having a second carrier thickness that is less than the first carrier thickness, providing socket contact springs, each comprising a hole support structure that supports the socket contact spring within the via, and a contact beam configured to contact a conductor of an integrated circuit to be placed within the socket connector assembly, wherein a portion of carrier having a first carrier thickness is configured to prevent the contact beam from inelastically deforming when bent under load. Advantageously, the use of pockets allows better support for the contact beam and prevents deformation.

In some embodiments, the providing of the pockets comprises performing a second patterned controlled depth drilling operation with a deep delete drill on the carrier having the first thickness to produce the pocket having the second thickness carrier. Advantageously, use of a deep delete drill allows the pockets to be located with precision and properly sized.

In some embodiments, the method comprises creating a keyhole-shaped feature with an end mill bit used in combination with the deep delete drill. Advantageously, this may be applied when the pitch of contacts is reduced to a point where a pocket drill diameter might become too large to leave enough material at the desired height.

In some embodiments, providing the pockets comprises applying a photo-imaged solder mask to a height of a first thickness on top of a laminate carrier of a second thickness. Advantageously, this allows the precision associated with photo-imaging techniques.

In some embodiments, the carrier comprises a molded plastic housing, and the method further comprises 3-D printing standoff and alignment features on a face of the socket connector assembly opposite the contact beam. Advantageously, this allows the precision associated with 3-D printing techniques and allows application of this technique on both sides of the socket, when applied to a molded plastic housing.

In some embodiments, the carrier comprises a laminate substrate housing, and the method further comprises 3-D printing standoff and alignment features on a face of the socket connector assembly opposite the contact beam. Advantageously, this allows the precision associated with 3-D printing techniques and allows application of this technique on both sides of the socket, when applied to a laminated substrate housing.

In some embodiments, the method further comprises providing a board upon which the socket connector assembly will be placed, providing a terraced standoff layer on the board to create recessed socket regions, and providing a 3-D printed standoff within the recessed socket region that supports the socket connector assembly. Advantageously, this allows the application of supports and standoffs, when used both as support for the contact beam as well as module support and alignment/positioning, to be applicable both to the socket connector assembly and the board upon which it is placed.

Disclosed herein is also a method for producing a land grid array (LGA) socket connector assembly. The method comprises providing a carrier having an array of vias, providing contact features on a top surface of the carrier adjacent to corresponding vias, where the contact features are made by at least one of: 1) a copper etching technique; 2) a copper etching and solder mask technique; and 3) a 3-D printing technique, providing socket contact springs, each comprising a hole support structure that supports the socket contact spring within the via, and a contact beam configured to contact a conductor of an integrated circuit to be placed within the socket connector assembly, wherein the contact features are configured to have a height that prevents the contact beams from inelastically deforming when bent under load. Advantageously, use of these techniques significantly improves the positioning, sizing, and shaping of support structure, allowing for smaller chip designs, and in some cases allowing for a closer hole pitch.

In some embodiments, the carrier comprises a copper layer above the carrier. The method further comprises applying an etch mask over contact feature regions in which the contact features are located, etching the copper layer to remove portions of the copper layer except whether the etch mask is located, and removing the etch mask, leaving copper support features adjacent to the respective via holes. Advantageously, use of copper etching techniques can improve the positioning, sizing, and shaping of the support structure.

In some embodiments, the carrier comprises a molded plastic housing, and the method further comprises 3-D printing standoff and alignment features on a face of the socket connector assembly opposite the contact beam. Advantageously, this allows the precision associated with 3-D printing techniques and allows application of this technique on both sides of the socket, when applied to a molded plastic housing.

In some embodiments, the material for the 3-D printing is selected from the group consisting of glass-particle-filled thermoplastics, other-particle-filled thermoplastics, curable filled epoxy materials, and polymers that contain conductive particles. Advantageously, use of these materials allows for various conductive properties to be controlled which at the same time allowing the necessary small-feature geometry to be created.

In some embodiments, material for the 3-D printing is a conductive metal paste, and the method further comprising bonding and sintering the 3-D printing with a laser operation. Advantageously, this technique allows a laser-sintering processes to be used for finer details on the support features.

In some embodiments, the carrier comprises a laminate substrate housing, and the method further comprises 3-D printing standoff and alignment features on a face of the socket connector assembly opposite the contact beam. Advantageously, this allows the precision associated with 3-D printing techniques and allows application of this technique on both sides of the socket, when applied to a laminate substrate housing.

In some embodiments, the contact features are 3-D printed with an X-Y-axis positional resolution down to ten microns, and Z-axis positional resolution down to fifty microns. Advantageously, this allows for sockets that can be created to handle smaller chip/module sizes.

In some embodiments, a board is provided upon which the socket connector assembly will be placed, providing a terraced standoff layer on the board to create recessed socket regions, and providing a 3-D printed standoff within the recessed socket region that supports the socket connector assembly. Advantageously, this creates a robust combination of the socket and the board upon which it is placed to prevent movement and possible damage.

In some embodiments, the carrier comprises a first hole and a second hole adjacent to the via. The method further comprises providing a contact feature that extends downward from a top surface of the carrier into the first hole and extends above the top surface of the carrier, and providing a standoff that extends downward from a bottom surface of the carrier from the second hole and an alignment feature that extends above the top surface of the carrier from the second hole. Advantageously, this allows for a better adherence of the support and alignment features to the board.

Disclosed herein is also an assembly, comprising a land grid array (LGA) socket connector assembly, the socket connector assembly comprising a carrier having an array of vias, support features on a top surface of the carrier adjacent to corresponding vias, wherein the contact features are made by at least one of: 1) a copper etching technique; 2) a copper etching and solder mask technique; and 3) a 3-D printing technique, socket contact springs, each comprising a hole support structure that supports the socket contact spring within the via, and a contact beam configured to contact a conductor of an integrated circuit to be placed within the socket connector assembly, wherein the support features are configured to have a height that prevents the contact beams from inelastically deforming when bent under load. Advantageously, such a structure making use of these techniques may be made smaller and more precise.

In some embodiments, the carrier comprises a molded plastic housing, and the socket connector assembly further comprises 3-D printed standoff and alignment features on a face of the socket connector assembly opposite the contact beam. Advantageously, this allows for techniques described herein to be used on both sides of the socket connector assembly which allows for better support and fit, particularly with smaller-sized sockets and their associated smaller sized chips/modules.

In some embodiments, the assembly further comprises a printed wiring board (PWB) comprising recessed regions on its upper surface and into which the socket connector assembly is located, a bottom surface of the socket connector assembly being in contact with support structures located on a top surface of the recessed regions, and a module that fits within a top-surface recess of the socket and has conductor contacts that are in contact with the contact beams. Advantageously, the combined board, socket, module/chip provides a complete board-level product that may be used in computers or other devices.

BRIEF DESCRIPTION OF THE DRAWINGS

Various embodiments are described herein with reference to different subject-matter. In particular, some embodiments may be described with reference to methods, whereas other embodiments may be described with reference to apparatuses and systems. However, a person skilled in the art will gather from the above and the following description that, unless otherwise notified, in addition to any combination of features belonging to one type of subject-matter, also any combination between features relating to different subject-matter, in particular, between features of the methods, and features of the apparatuses and systems, are considered as to be disclosed within this document.

In the drawings, various features may be described in a related format with reference numbering such that the numbering reflects similar items (e.g., 100.1, 100.2 . . . ). For the sake of brevity, such items may be referenced collectively or in a representative manner by only the first part of that numbering (e.g., 100).

The aspects defined above, and further aspects disclosed herein, are apparent from the examples of one or more embodiments to be described hereinafter and are explained with reference to the examples of the one or more embodiments, but to which the invention is not limited. Various embodiments are described, by way of example only, and with reference to the following drawings.

FIG. 1A is a pictorial diagram illustrating an example of a single contact of the array of contacts shown in FIG. 1B and HLGA socket shown in FIG. 1C.

FIG. 1B is a pictorial diagram illustrating an example of an array of contacts shown in FIG. 1A integrated into a socket contact carrier housing.

FIG. 1C is a pictorial diagram illustrating an HLGA socket made with a laminate contact carrier housing, including integrated contacts and integrated molded plastic module alignment frame and support features.

FIG. 2A is a pictorial diagram illustrating an example of a cross section of an LCP (liquid crystal polymer) connector housing with a single HLGA contact mounted in it.

FIG. 2B is a top-down view on the contact depicted in FIG. 2A.

FIG. 2C is a pictorial diagram illustrating contacts shown in FIG. 2A and FIG. 2B a mounted in a molded LCP plastic housing.

FIG. 2D is a pictorial diagram illustrating an HLGA socket made with an LCP plastic housing with molded in LCP module alignment frame and support features.

Figure 3A:
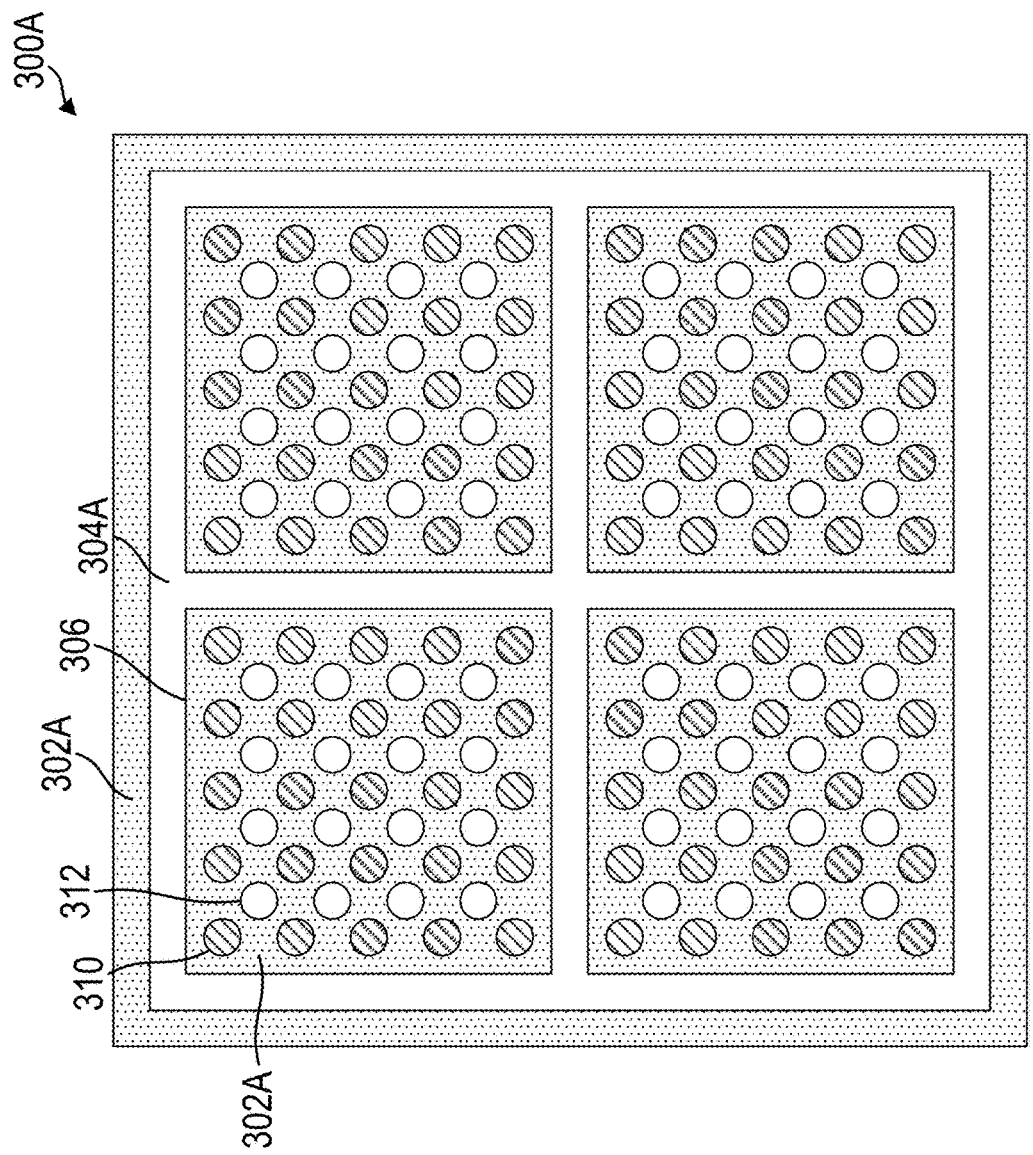

FIG. 3A is a prior art top view schematic diagram illustrating a prior art molded connector with molded in standoffs and alignment features.

FIG. 3B is a schematic top-view diagram illustrating a molded connector according to some embodiments.

FIG. 3C is a schematic top view diagram illustrating a molded connector similar to the molded connector shown in FIG. 3B, but with an even further reduced socket size with a reduced contact pitch and ultra-fine-featured 3-D printed alignment frame and standoffs.

Figure 4A:
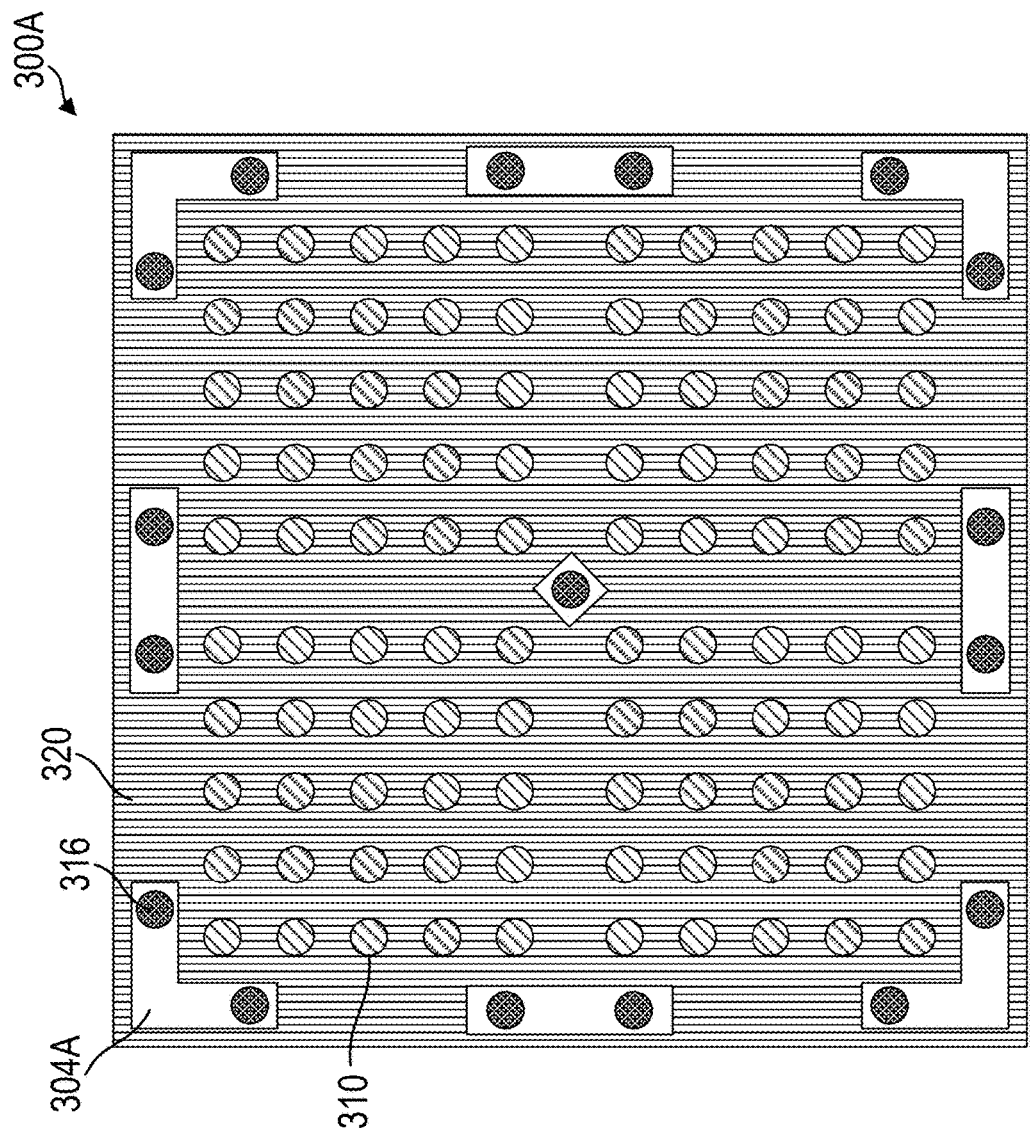

FIG. 4A is a schematic bottom view diagram illustrating the molded connector shown in FIG. 3A.

Figure 4C:
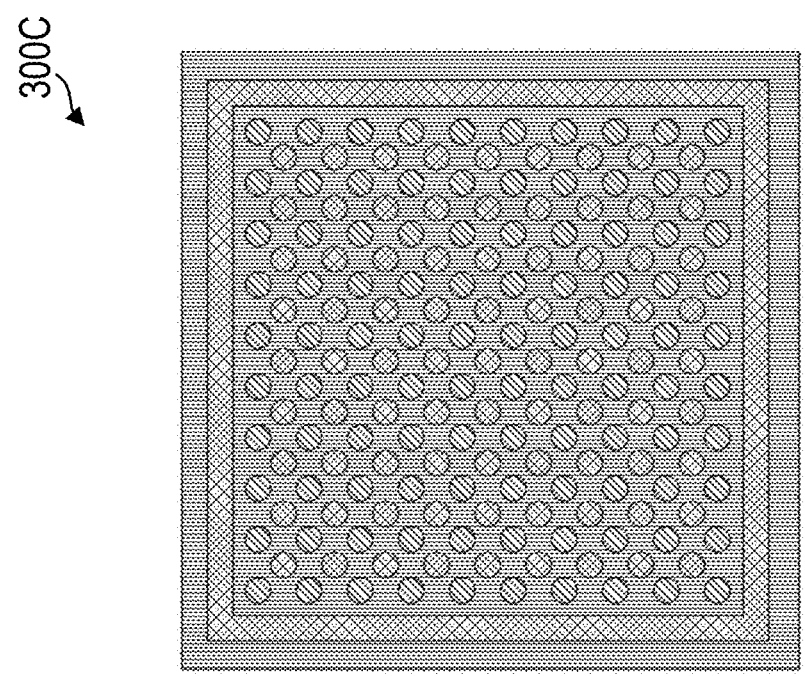
Figure 4B:
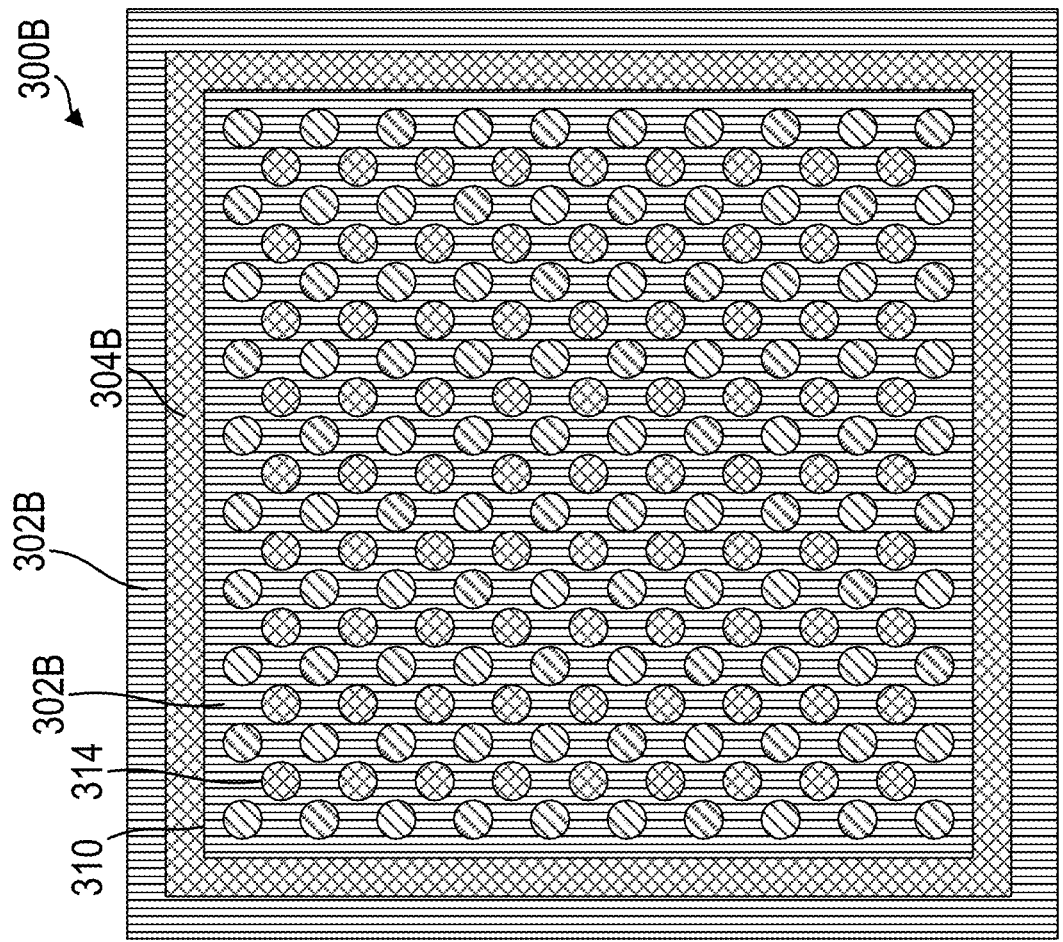

FIG. 4B is a pictorial bottom view diagram illustrating the molded connector shown in FIG. 3B, according to some embodiments.

FIG. 4C is a pictorial bottom view diagram illustrating the molded connector shown in FIG. 3C and having an even further reduced socket size with a reduced contact pitch and ultra-fine-featured 3-D printed alignment frame and standoffs.

FIGS. 5A-5E are pictorial diagrams showing isometric views, according to some embodiments, illustrating some combinations of standoff constructions on boards having depressed regions for receiving a connector.

Figure 6A:
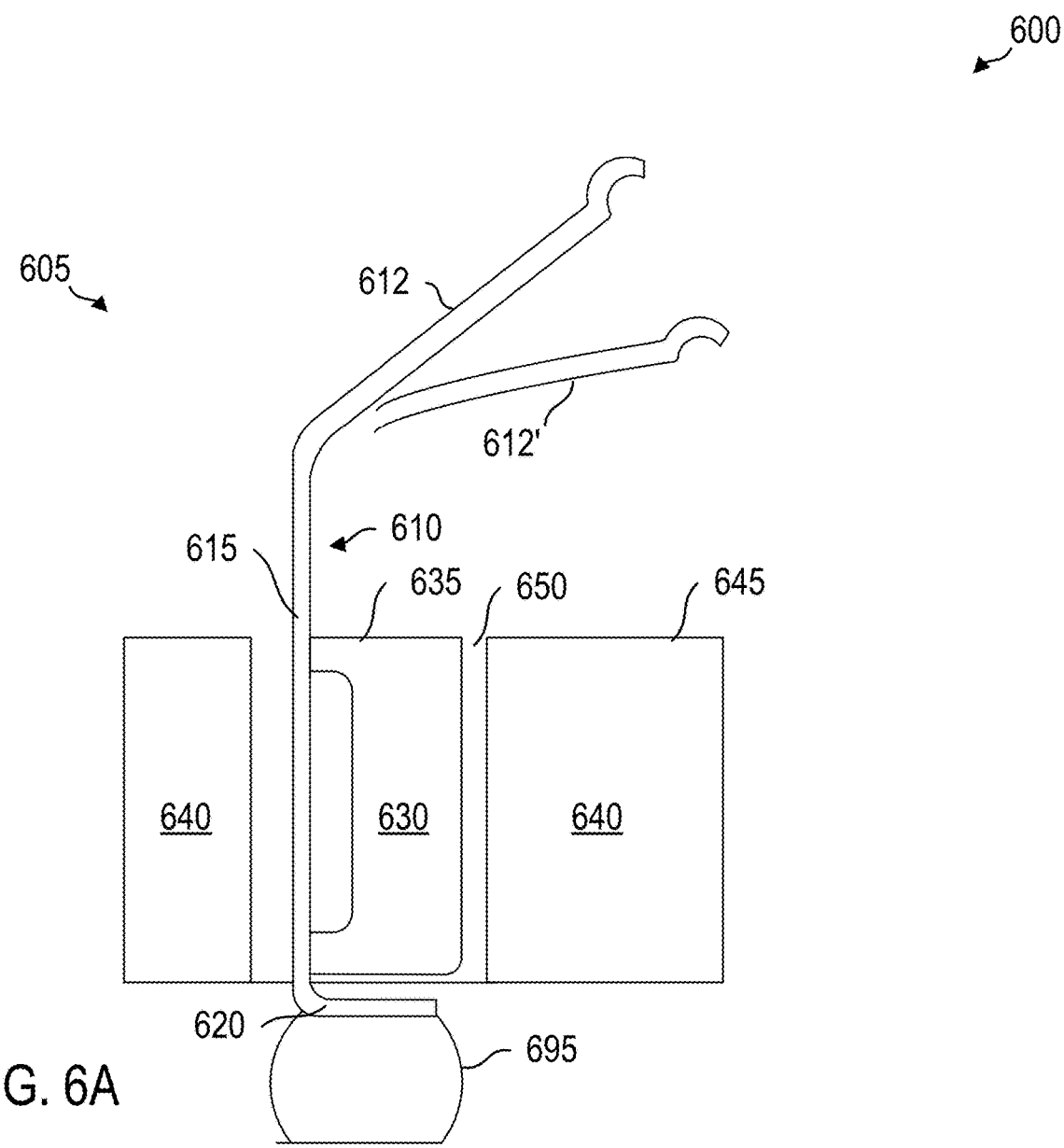

FIG. 6A is a schematic side-view diagram that illustrates an existing process of record (POR) base contact in a housing of an LGA or HLGA socket that may be used in various embodiments described herein.

Figure 6B:
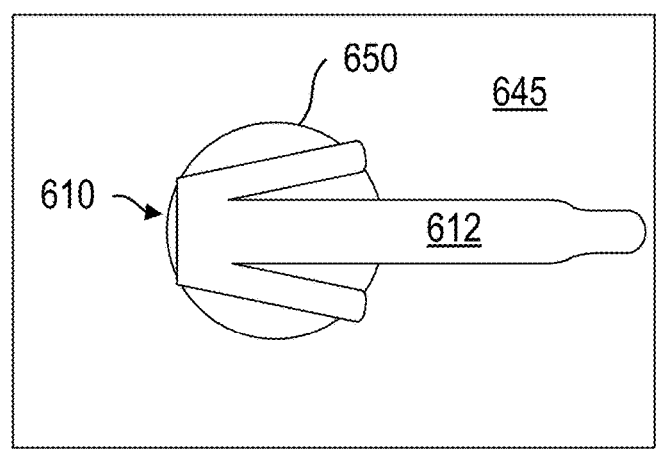

FIG. 6B is a schematic top-view diagram of the contact and base housing assembly shown in FIG. 6A.

Figure 7A:
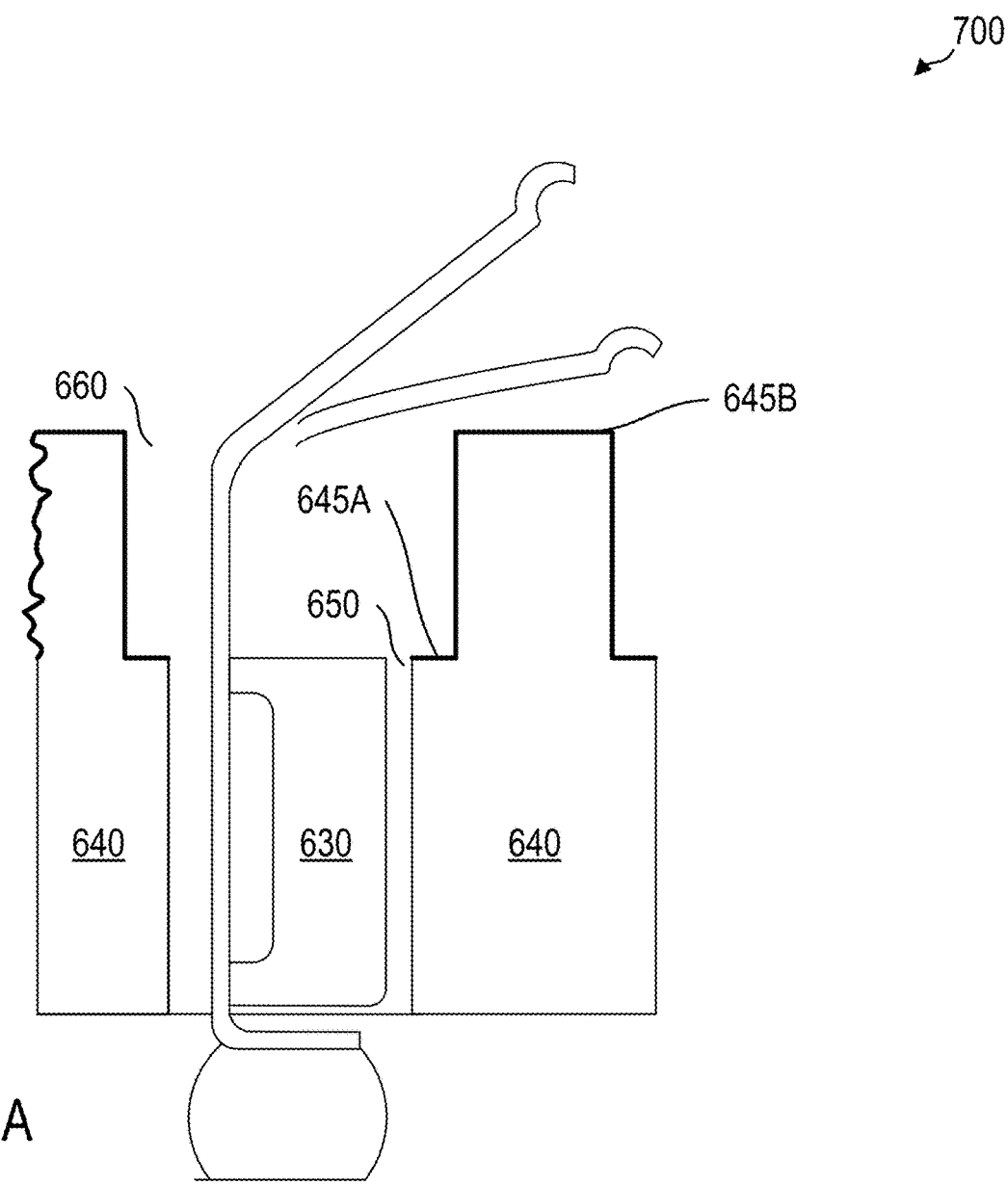

FIG. 7A is a side view that illustrates an first embodiment in which the laminate core carrier housing is applied thicker but having pockets around the vias.

Figure 7B:
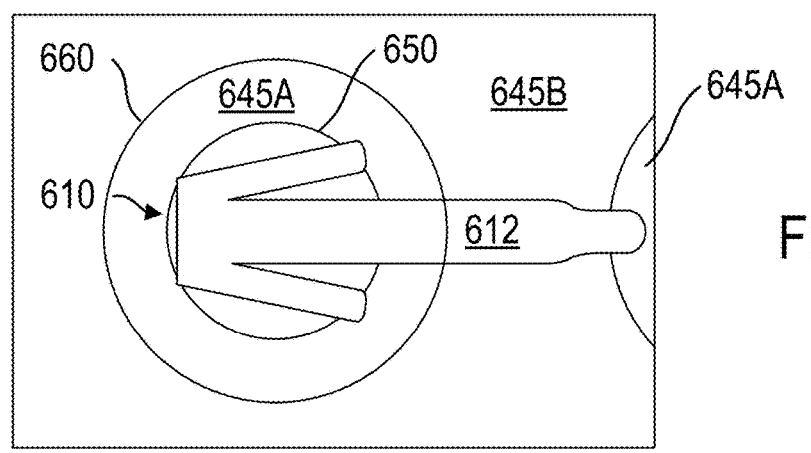

FIG. 7B is a pictorial top-view diagram of the base assembly shown in FIG. 7A.

Figure 8A:
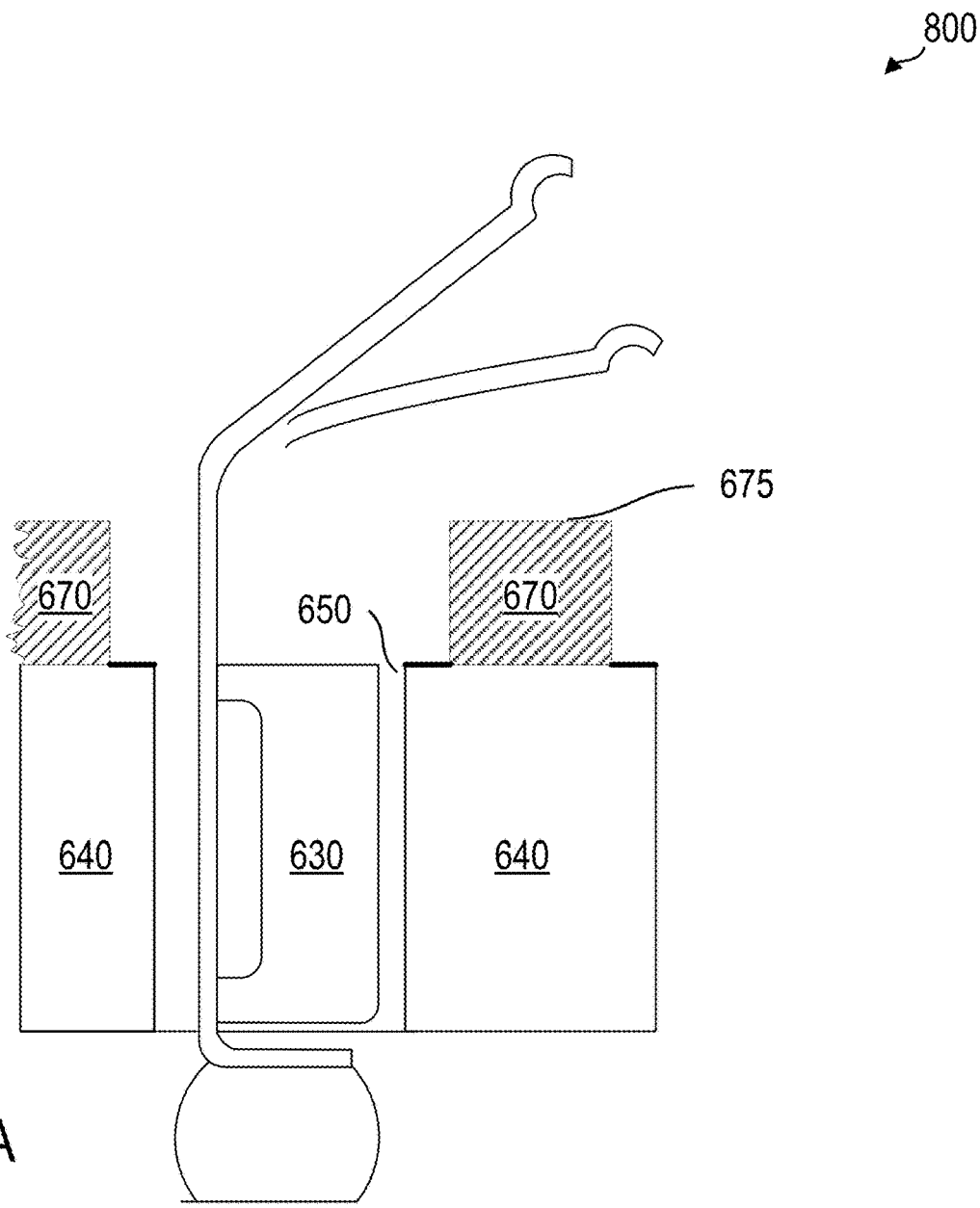

FIG. 8A is a schematic side view showing a variant of another embodiment, having standoffs etched from a top copper layer.

Figure 8B:
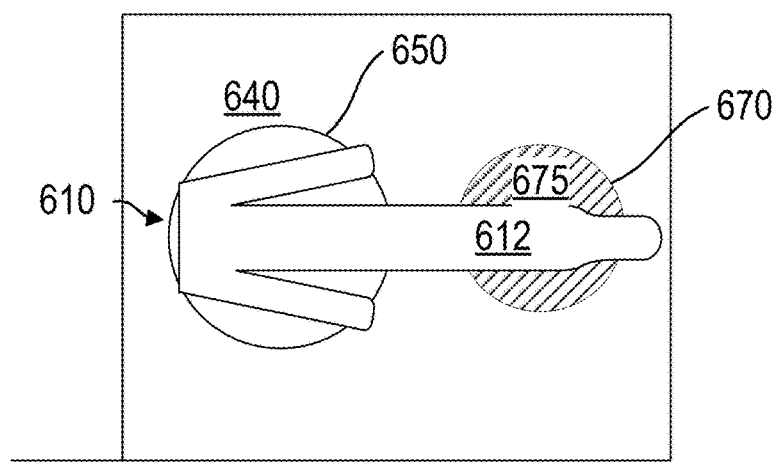

FIG. 8B is a schematic top-view diagram of the base assembly shown in FIG. 8A.

Figure 9A:
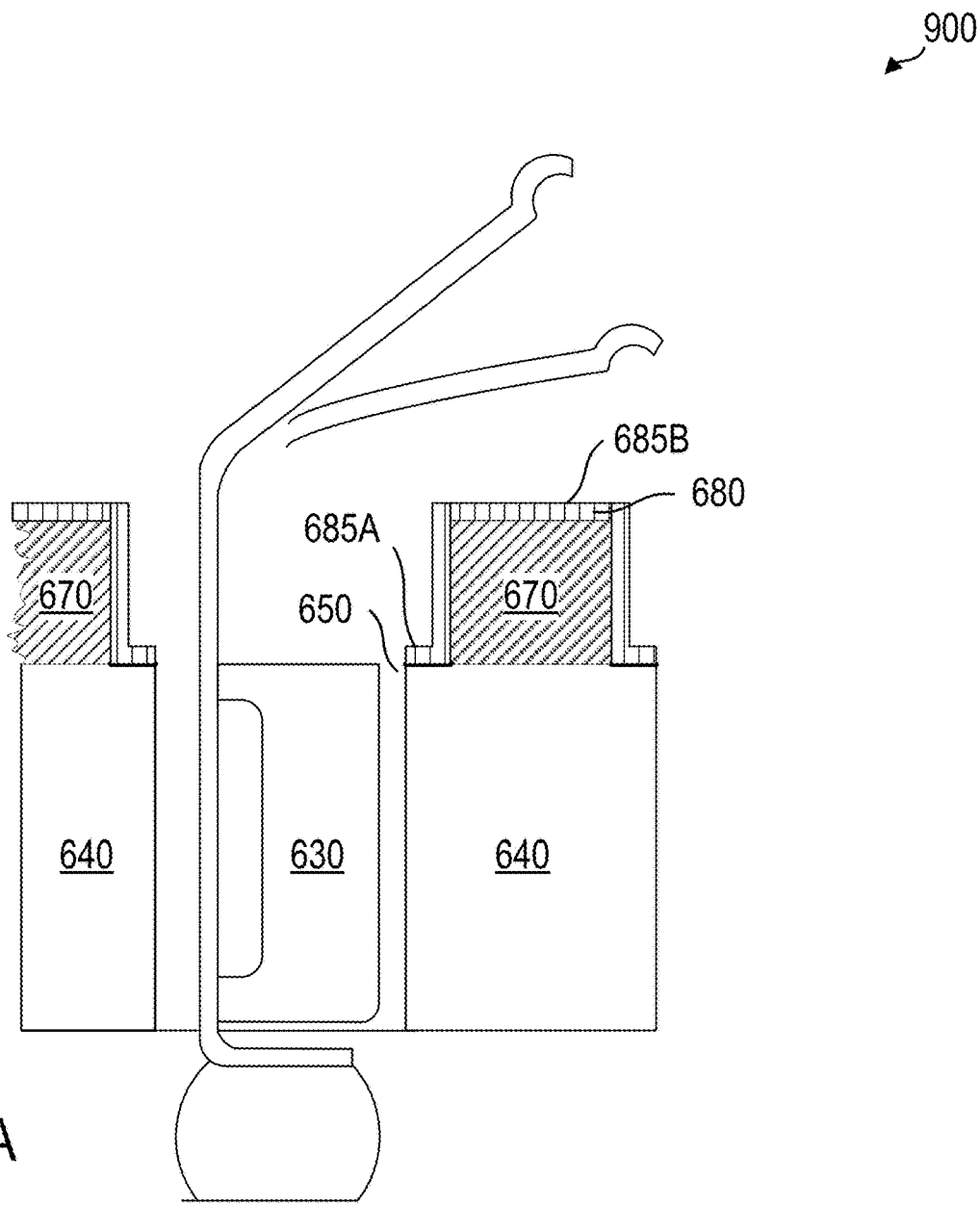

FIG. 9A is a schematic side view showing another variant of this embodiment, shown with the results of applying a solder mask to the etched copper standoffs.

Figure 9B:
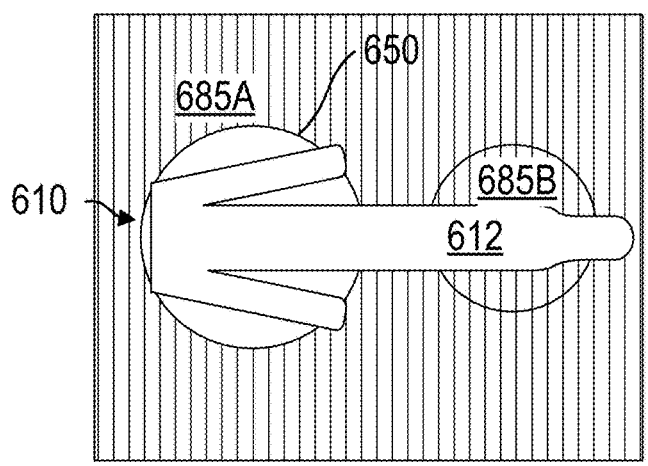

FIG. 9B is a schematic top-view diagram of the base assembly shown in FIG. 9A.

Figure 10A:
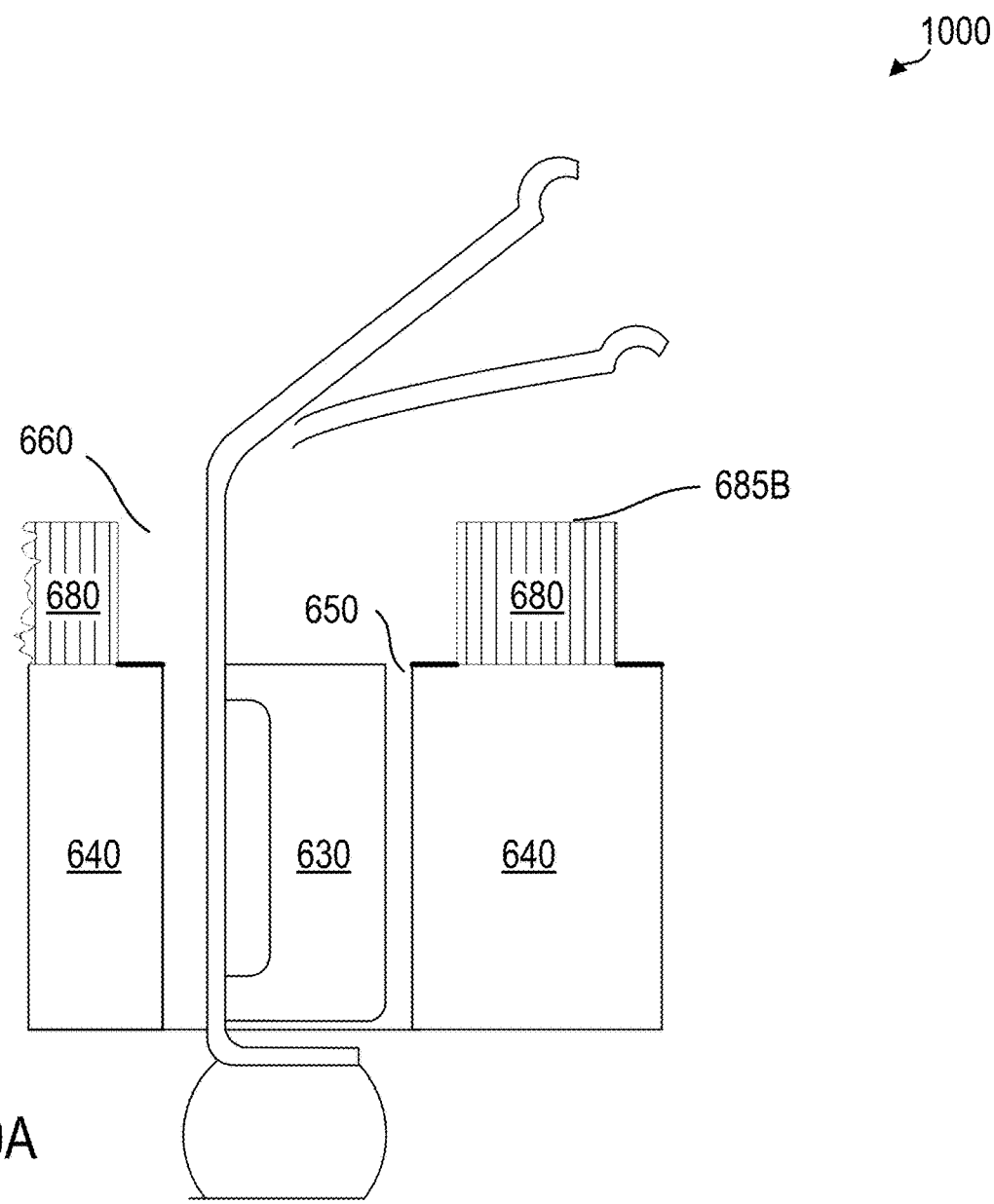

FIG. 10A is a schematic side view showing another embodiment in which a photo-imaged solder mask is applied to create the stand-off or downstop features made of the solder material.

Figure 10B:
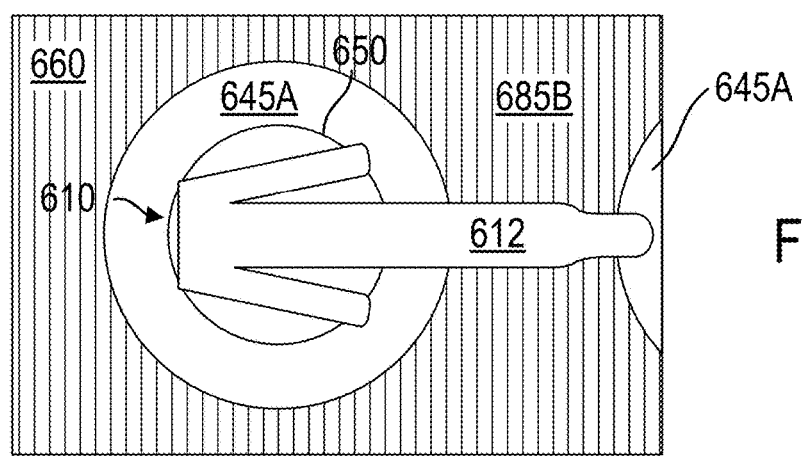

FIG. 10B is a schematic top-view diagram of the base assembly shown in FIG. 10A.

Figure 11A:
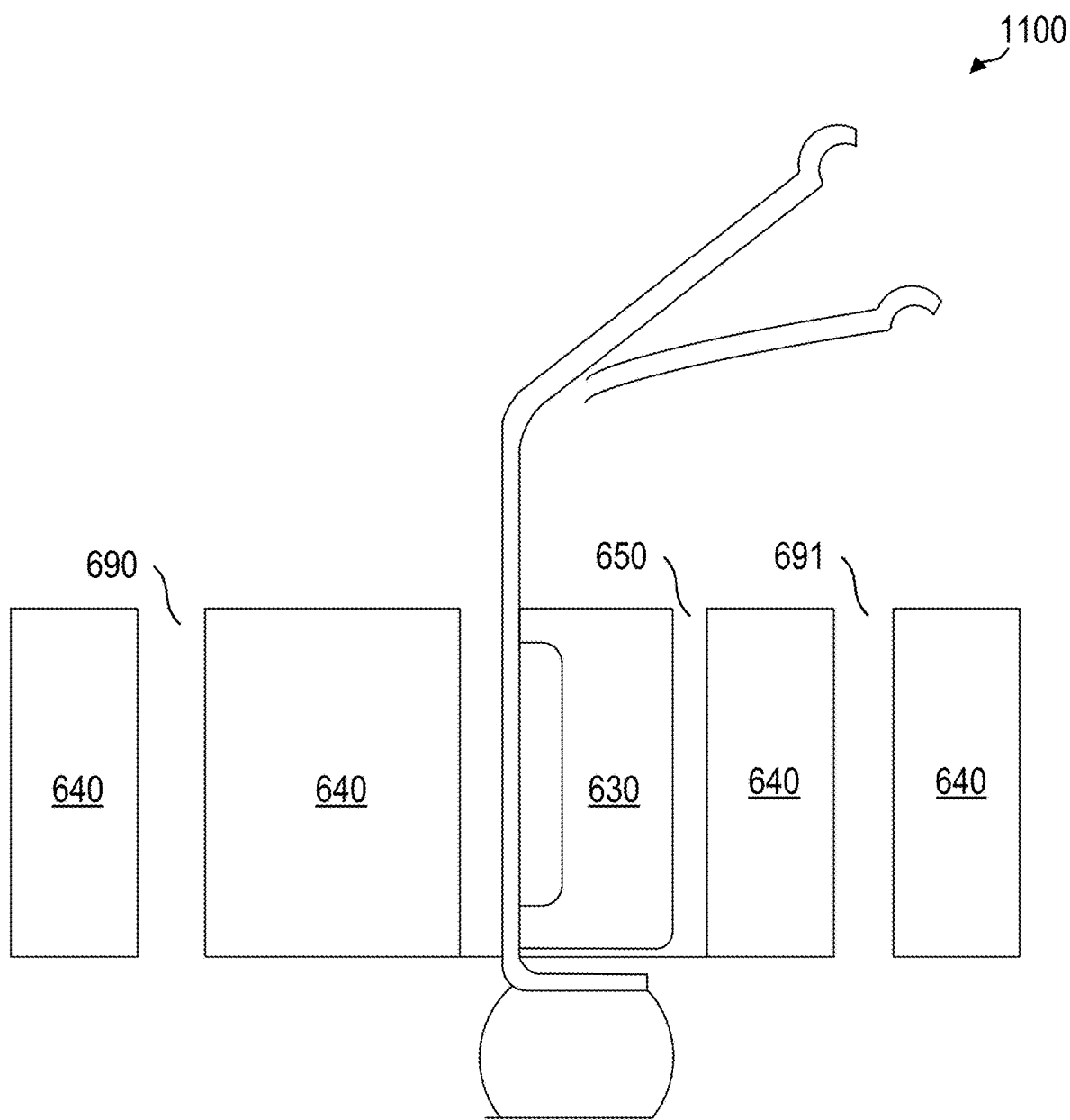
Figure 11B:
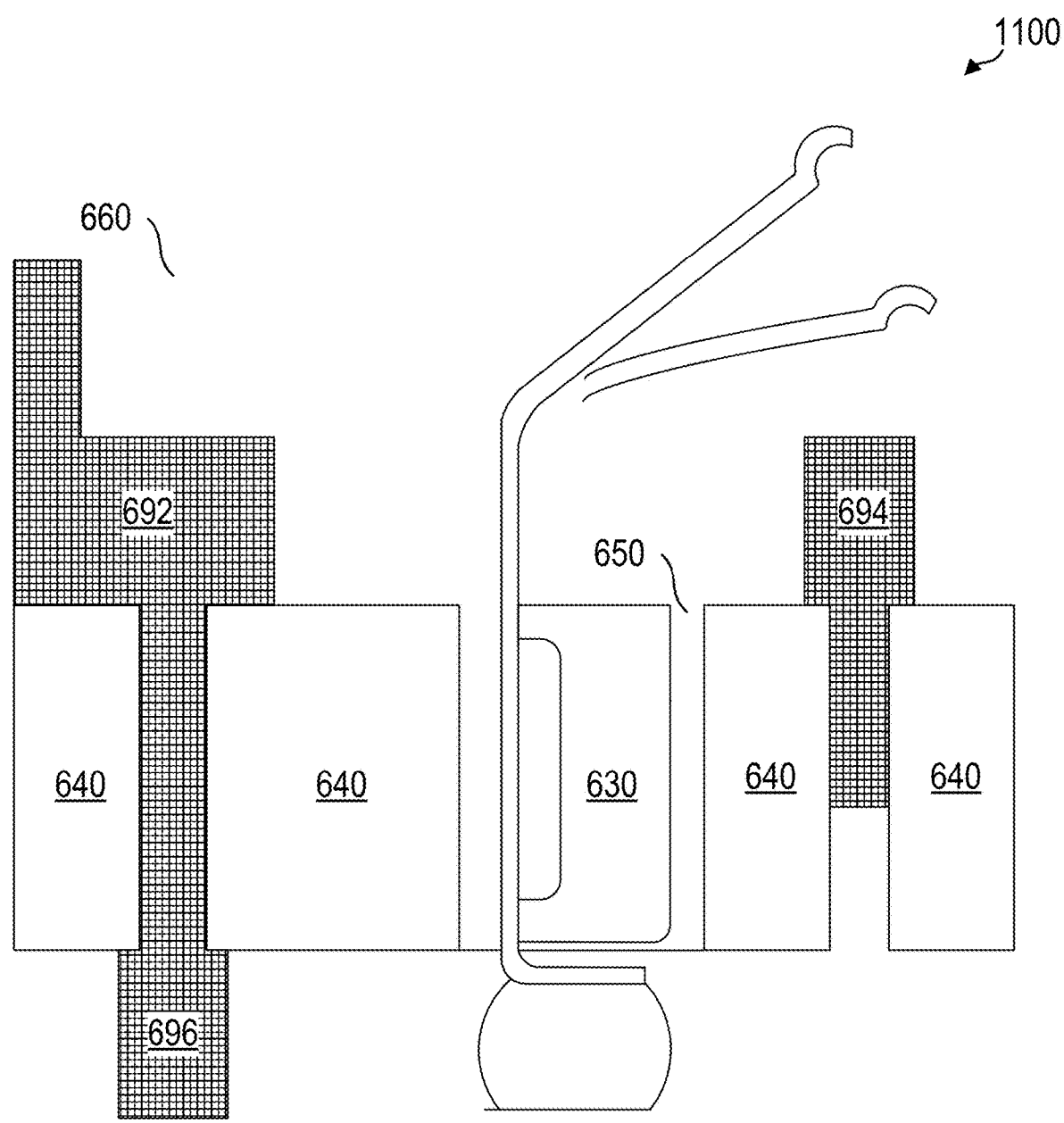

FIGS. 11A and 11B are side views of another embodiment that show additional holes that are provided on the laminate carrier 640 with standoffs and downstop features added utilizing injection molding.

DETAILED DESCRIPTION

The diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention are presented for purposes of illustration, but are not intended to be exhaustive or limited to the embodiments disclosed. Many modifications and variations will be apparent to those of ordinary skill in the art without departing from the scope and spirit of the described embodiments. The terminology used herein has been chosen to best explain the principles of the embodiments, the practical application or technical improvement over technologies found in the marketplace, or to enable others of ordinary skill in the art to understand the embodiments disclosed herein.

Standoff Structures for Reliable LGA & HLGA Interconnects

Provided herein are a combination of new standoff addition methods to enable miniaturization of HLGA/LGA socket designs. The methods include the use of high-definition 3-D printing of standoffs onto connector housings, modules, or PWB surfaces that may also be coupled with optional additions of terraced module and/or PWB substrate surfaces made by using sequential PWB or module lamination steps. These are illustrated by FIGS. 3A-4C, discussed in more detail below.

When used singularly or in combination, these options offer solutions for full support on modules with a reduced LGA pitch. The options also minimize the overall required module size and board space by minimizing the size of the perimeter standoff geometry used for module support and module alignment. In addition, given the high-resolution placement capability of 3-D printed standoffs, and with proper material selection for the manufacture of standoffs, custom standoff placements may be possible that optimize (minimize) detrimental dynamic warp behavior of HLGA sockets during reflow while reducing overall board and module strains.

Certain various embodiments described herein provide standoffs for alignment and support features on LGA/HLGA module-socket-PWB packaging by 3-D printing glass-particle-filled or other-particle-filled thermoplastics or curable filled epoxy materials onto preferred substrate surfaces for the specific packaging design. This includes deposition onto the top or bottom surfaces of the HLGA/LGA connector housing or onto the module or PWB surfaces as well.

With a printed X-Y positional resolution to 0.01 mm (10 microns) and a Z-axis resolution to 0.05 mm, existing 3-D printing technology is clearly sufficient to enable addition of alignment and support features for reduced pitch HLGA/LGA connectors, modules, and boards in which the pitch is in the sub-millimeter range, specifically on the order of less than 1 mm to mm or smaller. Because the addition of these features on the top or bottom surfaces of an LGA/HLGA connector may create contact insertion constraints or incompatibilities with the connector assembly processes, the flexibility to add some standoff features to other parts of the assembly is an advantage for implementation.

FIG. 3A is a schematic top-view diagram illustrating a prior art molded connector 300A and molded in standoffs and alignment features. In FIG. 3A, the molded plastic-based socket housing 302A may be made of glass-filled LCP. Molded standoff and alignment features 304A (that create alignment regions 306) and standoffs 312 may be provided in or on the socket housing 302A and may also be made of glass-filled LCP. FIG. 3A also shows LGA/HLGA contacts 310 in the socket housing 302A.

FIG. 3B is a schematic top-view diagram illustrating a molded connector 300B according to some embodiments. It is similar to the design shown in FIG. 3A, but with reduced size that is enabled by the 3-D printing. Greater precision resulting from the 3-D printing and the reduced socket size enable a simplification of the alignment features 304B and the standoffs 314, which may be printed on the housing using 3-D printing techniques. In the design shown in FIG. 3B, the contact pitch is the same as that shown in FIG. 3A.

FIG. 3C is a schematic top view diagram illustrating a molded connector 300C similar to the molded connector 300B, but with an even further reduced socket size with a reduced contact pitch and ultra-fine-featured 3-D printed alignment frame and standoffs.

FIG. 4A is a pictorial bottom view diagram illustrating the molded connector 300A shown in FIG. 3A. Molded standoff and alignment features 304A may be provided in or on the substrate-based socket housing 320 using glass filled LCP. Heat stake attach points 316 are shown for molded standoffs 304A.

FIG. 4B is a pictorial bottom view diagram illustrating the molded connector 300B shown in FIG. 3B, according to some embodiments. FIG. 4B also illustrates the reduced socket size enabled by the 3-D-printed alignment features 304B and standoff features 314. FIG. 4B may include molded plastic-based socket housing 302B similar to molded plastic-based socket housing 302A of FIG. 3B.

FIG. 4C is a pictorial bottom view diagram illustrating the molded connector 300C shown in FIG. 3C and having an even further reduced socket size with a reduced contact pitch and ultra-fine-featured 3-D printed alignment frame and standoffs.

Figure 5E:
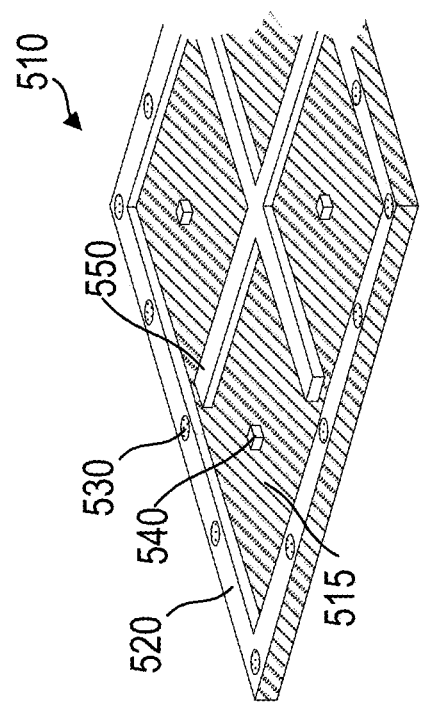

FIGS. 5A-5E are pictorial diagrams showing isometric views, according to some embodiments, illustrating some combinations of standoff constructions, as shown on PWB 500 and substrates. In FIG. 5A a terraced layer 520 has regions 510 for socket attachments. These regions 510 are depressed and show an underlying other PWB or module substrate laminate 515. The terrace layer 520 is shown in FIG. 5A with global coverage on the entire board 500, but it can be made locally.

FIG. 5B illustrates more clearly the 3-D nature of the depressed regions 510 on the BSM side of the LGA/HLGA module 500 as featured portions of the terraced layer 520 within which features (e.g., standoffs) are provided.

Figure 5D:
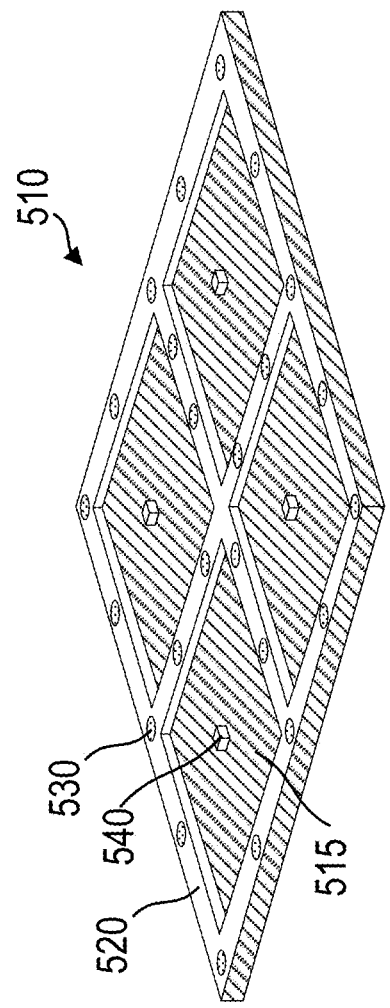

FIG. 5C illustrates the featured portions 525 shown in FIG. 5B having ground vias 530 along the featured portions. FIG. 5D illustrates the module 500 having 3-D standoffs 540 added within the depressed regions 510. FIG. 5E illustrates the module 500 similar to that shown in FIG. 5D, with the exception that the inside featured portions 525 in the form of a cross have been replaced with 3-D printed custom standoffs 550 that may support the sockets.

The standoff features described above may also be optionally 3-D printed using polymers that contain conductive particles. The features may be directly applied to exposed ground plane shapes present on the top surface of the module substrate or PWB surface by creating apertures in the overlying solder mask to expose a desired geometry of ground plane for standoff application.

The mask may be applied on the board or substrate prior to 3-D printing the conductive material. A solder mask is part of a typical PWB or organic laminate module substrate. It is an electrically insulative polymeric coating that may be applied in a pattern with a screen printing operation, or it may be applied as a thin sheet. The coating may then be photoimaged with a pattern where the uncured unexposed areas may be removed with a wash chemistry to leave the desired pattern defined. The openings in the mask patterns expose copper that is, in many applications, intended to receive solder for connecting components, etc. The mask prevents solder from getting onto other surfaces to prevent shorts, contamination, and other related problems. In the present case, to create conductive standoffs, these regions of metal on the board or substrate are exposed by not having an older mask present at those areas as part of the board fabrication process. Then, to make conductive standoffs, the 3-D printing may be used to form them on the exposed metal regions of the board or substrate that are surrounded by the insulative solder mask.

The standoff features may provide for additional electromagnetic compatibility (EMC) or SI shielding critical for high-speed applications (50 gigabit per second and beyond). If desired, 3-D printing metal standoffs may also be possible by using conductive metal pastes coupled with the use of additive manufacturing laser operations to provide bonding and sintering of standoff features to one or more of the packaging surfaces.

Depending on the printed material used, these 3-D printed features may also serve to provide additional shielding against contact corrosion by providing reactive surfaces that help with gettering sulfur and other corrosive gases from the working environment (e.g., the deposition/processing of highly cross-linked, rigid, Ag-filled silicone standoffs).

Depending on socket contact insertion requirements into LGA/HLGA socket housings, 3-D printing of standoff and alignment features may be preferable before or after contact insertion.

Optional standoff constructions for perimeter alignment and seating of sockets or modules may also be created by making the terraced PWB or module surfaces using laser cut laminates that can be attached to the substrates using conventional lamination or via secondary adhesively bonding to the substrate surfaces. In either case, these alignment/standoff features can be coupled with use of local, 3-D-printed, small, high-resolution standoff features for additional design flexibility, design space savings, and load/strain optimization on the packaging configuration to ensure high reliability.

Similar to the use of conductive 3-D-printed pastes as standoffs, the solution may provide vias, as shown in FIGS. 5C-5E, connecting through to an underlying ground plane in the terraced perimeter standoff features for the PWB or substrate to create a ground fence for additional SI or EMC shielding around the LGA connections.

Similar constructions can also support BGA module packages requiring large mass heatsinks affixed under load to prevent solder joint damage (e.g., field programmable gate arrays and graphics processing units).

FIG. 6A is a pictorial side-view diagram that illustrates a known plan of record (POR) base design 605 for an LGA or HLGA socket 600 that may be used in various embodiments described herein. The main components of the base 605 for an example HLGA socket include a socket contact spring 610, a laminate core carrier housing 640, and a solder ball 695. A hole support structure 630 of the socket contact spring 610 has its top surface 635 coplanar with a housing top surface 645 of the housing 640. The housing 640 has a hole aperture 650 (or via) into which the socket contact spring 610 sits. The socket contact spring 610 may comprise a contact beam 612, a mid-section 615, and a PCB contact end 620. The contact beam 612 is a bent section that resiliently (in proper operation) flexes to a new position 612' when a load is placed on it. However, without a support beneath the contact beam 612, if excessive force is placed on the contact beam 612, the socket contact spring 610 may inelastically deform and result in a failure. The PCB contact end 620 may be affixed to the solder ball 695 that ultimately contacts the PCB upon which the socket 600 is placed. FIG. 6B is a pictorial top-view diagram of the base assembly 605 shown in FIG. 6A.

FIGS. 7A-11B are side and top views of various embodiments of the socket 600 having different standoff and downstop features. FIG. 7A is a side view that illustrates a first embodiment 700, Embodiment 1, in which the laminate core carrier housing 640 is made thicker than the one shown in FIG. 6A-namely, the upper housing top surface 645B extends above the feature top surface 635 to an upper housing top surface 645B height such that it serves as a stop to the contact beam 612 when it is in its maximum bent position 612'. In FIG. 7A, the housing top surface 645 shown in FIG. 6A is broken down into two surfaces: a lower housing top surface 645A, and an upper housing top surface 645B.

The housing 640 may initially be made thicker, where its entire surface corresponds to the upper housing top surface 645B. In Embodiment 1, patterned, controlled depth drilling operations are provided on the housing 640 to create pockets 660 around the primary individual contact array throughhole 650 apertures. Without the presence of pockets 660, in this design (i.e., the thicker housing portion extends right up to the through-holes 650), the connector may not function properly for a number of reasons. The contacts are press fit into smaller-diameter holes that are designed to provide a pitch and contact spacing that ensures electrical signal integrity properties. Press fitting into larger holes would require the contacts be larger in diameter. Larger holes through the carrier may also undermine the structural integrity of the carrier, as the web of remaining laminate housing material between the holes would be very thin and prone to cracking or breaking open when contacts are inserted/press fit.

Using this construction and process, once the pocket 660 has been drilled, the remaining material forming the upper housing top surface 650 in between the through hole 650 array pattern provides the contact beam 612 downstop seating surface. The operations used to create these pocket drill holes 660 may be similar to processes used to partially remove metal plating in PTHs (plated through holes) to a controlled depth on specific vias in circuit boards that connect high speed signals within of circuit boards to improve electrical signal integrity. In some embodiments, this drilling of the drill hole 660 may use an end mill bit to extend the drill hole 660 into a keyhole-shaped pocket (not shown), if needed. This may be needed when the pitch of contacts is reduced to a point where a pocket drill diameter might become too large to leave enough material at the desired height. FIG. 7B is a top view that shows the shape of the pocket 660 and the respective housing surfaces 645A, 645B from a different perspective.

FIG. 8A is a side view showing a first variant of a second embodiment 800, Embodiment 2a. This embodiment variant is a custom contact variant (also referred to herein as a custom support feature or contact feature), distinguished from the pocket-based variant described above. In the custom contact-based variants, a small custom support feature is formed as a bump adjacent to the via and provides a higher area that supports the contact beam and prevents its overtravel. In this embodiment variant, a copper layer is formed on top of the laminate core carrier housing 640 to create individual contact downstops as contact features 670 (and/or standoff shapes) on the housing 640. The contact features 670 may be in a cylindrical shape, as can be seen in FIG. 8B, which is a top view, but it may also be constructed as a square, rectangle, any polygon, or any other shape in the top view provided that the contact feature/custom support feature 670 is capable of supporting the contact beam 612 or, when formed as a standoff, can prevent movement of the housing relative to the PCB. The copper contact feature 670 is formed on the laminate core carrier housings 640 using, e.g., typical masking and etching processes provided for manufacture of copper wiring features on circuit boards. In this embodiment, a copper layer top surface 675 comes into contact with the contact beam 612 to prevent overtravel.

FIG. 9A is a side view showing a second variant of the second embodiment 900, Embodiment 2b. In this embodiment variant, once the copper layer has been etched to form the etched copper downstops 670, a solder mask 680 is applied to coat the housing top surface 645 and the etched copper downstop 670 (contact feature). As can be seen in FIG. 9B, which is a top view, the solder mask 680 comprises a lower surface 685A and an upper surface 685B, the latter contacting the contact beam 612 to prevent overtravel.

FIG. 10A is a side view showing a third embodiment 1000, Embodiment 3. In this embodiment, an organic polymer-based photo-imaged solder mask 680 is applied to create the stand-off or downstop features to create the pocket 660 in which the through hole 650 exists. FIG. 10B is a top view of Embodiment 3.

FIGS. 11A and 11B are side views of a fourth embodiment 1100, Embodiment 4. FIG. 11A shows additional holes 690, 691 that are provided on the laminate carrier 640. The custom standoff 692 and downstop 694 features may then be added utilizing, e.g., injection molding. A standoff portion 696 may have a larger diameter than the additional hole 690 that it is placed in to further strengthen the affixing of the standoff 692 to the housing 640. Additionally, by having a portion of the downstop 694 extend into the additional hole 691 may help to affix it to the carrier/housing 640 more firmly. This technique may be used alone or in combination with other embodiments described herein.

Any of the first through fourth embodiments described above with respect to FIGS. 8A through 11B may be used to create standoffs in the module designs described above with respect to FIGS. 3A through 5E. In some embodiments, this includes using the 3-D printing standoff concept described above, as well as any of the above methods to create standoff and downstop structures on organic laminate modules and printed circuit boards. In some embodiments, these techniques may be used individually or in any combination on a single substrate. In some embodiments, any of the structures or procedures described above may be applied to their use on LGA connectors and HLGA sockets.

In addition, many unique integrated electronics structures that mount modules onto PCBs in computer systems can be produced when using combinations of both PCB and socket structures described herein as detailed in FIG. 3 through FIG. 11. Specifically, unique combinations of PCB and socket hardware made with different standoff and downstop configurations produced by methods described herein may be integrated together within a stack of system mechanical hardware needed to mount a module into a system. For example, integrated mounting configurations could include a PCB backplane with terraced board features and 3-D printed standoffs as illustrated in FIG. 5 integrated to HLGA socket structures soldered to its surface that possess contact downstop and socket standoff features produced by any of the methods described and shown in FIG. 7, 8, 9 or 11.

Examples

The following examples illustrate various embodiments.

Example 1 is a method for producing a land grid array (LGA) socket connector assembly, comprising:
  providing a carrier having a first carrier thickness with an array of vias, each having a first diameter;
  providing pockets around top surfaces of the vias, each having a second diameter and creating a portion of the pockets having a second carrier thickness that is less than the first carrier thickness;
  providing socket contact springs, each comprising:
    a hole support structure that supports the socket contact spring within the via; and a contact beam configured to contact a conductor of an integrated circuit to be placed within the socket connector assembly;

wherein a portion of carrier having a first carrier thickness is configured to prevent the contact beam from inelastically deforming when bent under load.

Example 2 is the method of example 1, wherein providing the pockets comprises performing a second patterned controlled depth drilling operation with a deep delete drill on the carrier having the first thickness to produce the pocket having the second thickness carrier.

Example 3 is the method of example 2, further comprising creating a keyhole-shaped feature with an end mill bit used in combination with the deep delete drill.

Example 4 is the method of any of examples 1 through 3, wherein providing the pockets comprises:
applying a photo-imaged solder mask to a height of a first thickness on top of a laminate carrier of a second thickness.

Example 5 is the method of any of examples 1 through 4:
wherein the carrier comprises a molded plastic housing; and
the method further comprises:
3-D printing standoff and alignment features on a face of the socket connector assembly opposite the contact beam.

Example 6 is the method of any of examples 1 through 4:
wherein the carrier comprises a laminate substrate housing; and
the method further comprises:
3-D printing standoff and alignment features on a face of the socket connector assembly opposite the contact beam.

Example 7 is the method of any of examples 1 through 6, further comprising:
providing a board upon which the socket connector assembly will be placed;
providing a terraced standoff layer on the board to create recessed socket regions; and
providing a 3-D printed standoff within the recessed socket region that supports the socket connector assembly.

Example 8 is a method for producing a land grid array (LGA) socket connector assembly, comprising:
providing a carrier having an array of vias;
providing contact features on a top surface of the carrier adjacent to corresponding vias, wherein the contact features are made by at least one of: 1) a copper etching technique; 2) a copper etching and solder mask technique; and 3) a 3-D printing technique;
providing socket contact springs, each comprising:
a hole support structure that supports the socket contact spring within the via; and
a contact beam configured to contact a conductor of an integrated circuit to be placed within the socket connector assembly;
wherein the contact features are configured to have a height that prevents the contact beams from inelastically deforming when bent under load.

Example 9 is the method of example 8, wherein the carrier comprises a copper layer above the carrier, the method further comprising:
applying an etch mask over contact feature regions in which the contact features are located;
etching the copper layer to remove portions of the copper layer except whether the etch mask is located; and
removing the etch mask, leaving copper support features adjacent to the respective via holes.

Example 10 is the method of example 9, further comprising:
after the etching of the copper support features, applying a solder mask to coat the carrier top surface and etched copper support features.

Example 11 is the method of any of examples 8 through 10:
wherein the carrier comprises a molded plastic housing; and
the method further comprises:
3-D printing standoff and alignment features on a face of the socket connector assembly opposite the contact beam.

Example 12 is the method of example 11, wherein material for the 3-D printing is selected from the group consisting of glass-particle-filled thermoplastics, other-particle-filled thermoplastics, curable filled epoxy materials, and polymers that contain conductive particles.

Example 13 is the method of any of examples 11 through 12:
wherein material for the 3-D printing is a conductive metal paste; and
the method further comprising:
bonding and sintering the 3-D printing with a laser operation.

Example 14 is the method of any of examples 8 through 13:
wherein the carrier comprises a laminate substrate housing; and
the method further comprises:
3-D printing standoff and alignment features on a face of the socket connector assembly opposite the contact beam.

Example 15 is the method of any of examples 8 through 14, wherein the contact features are 3-D printed with an X-Y-axis positional resolution down to ten microns, and Z-axis positional resolution down to fifty microns.

Example 16 is the method of any of examples 8 through 15, further comprising:
providing a board upon which the socket connector assembly will be placed;
providing a terraced standoff layer on the board to create recessed socket regions; and
providing a 3-D printed standoff within the recessed socket region that supports the socket connector assembly.

Example 17 is the method of any of examples 8 through 16:
wherein the carrier comprises a first hole and a second hole adjacent to the via;
the method further comprising:
providing a contact feature that extends downward from a top surface of the carrier into the first hole and extends above the top surface of the carrier; and
providing a standoff that extends downward from a bottom surface of the carrier from the second hole and an alignment feature that extends above the top surface of the carrier from the second hole.

Example 18 is an assembly, comprising:
a land grid array (LGA) socket connector assembly, comprising:
a laminate carrier housing having an array of vias;
support features on a top surface of the carrier adjacent to corresponding vias, wherein the contact features are made by at least one of: 1) a copper etching technique; 2) a copper etching and solder mask technique; and 3) a 3-D printing technique;

socket contact springs, each comprising:
a hole support structure that supports the socket contact spring within the via; and
a contact beam configured to contact a conductor of an integrated circuit to be placed within the socket connector assembly;
wherein the support features are configured to have a height that prevents the contact beams from inelastically deforming when bent under load.

Example 19 is the assembly of example 18:
wherein the carrier comprises a molded plastic housing; and
the socket connector assembly further comprises:
3-D printed standoff and alignment features on a face of the socket connector assembly opposite the contact beam.

Example 20 is the assembly of example 18, further comprising:
a printed wiring board (PWB) comprising recessed regions on its upper surface and into which the socket connector assembly is located, a bottom surface of the socket connector assembly being in contact with support structures located on a top surface of the recessed regions; and a module that fits within a top-surface recess of the socket and has conductor contacts that are in contact with the contact beams.

REFERENCE NUMBERS

TABLE 2

Table of Reference Numbers

| | |
|---|---|
| 100 | HLGA socket connector |
| 110 | spring contact array |
| 120 | LGA/HLGA contact; interconnect contact |
| 130 | housing; molded plastic housing; housing made from PCB laminate materials |
| 300A | prior art molded connector |
| 300B | molded connector |
| 300C | molded connector |
| 302A | molded plastic-based socket housing |
| 304A | molded standoff and alignment features |
| 304B | alignment features |
| 306 | alignment regions |
| 310 | LGA/HLGA contact |
| 312 | standoff |
| 316 | heat stake attach points for molded standoffs |
| 320 | substrate-based socket housing |
| 500 | PWB |
| 510 | regions |
| 515 | PWB or module substrate laminate |
| 520 | terraced layer |
| 525 | featured portion of a terraced layer |
| 530 | ground vias |
| 540 | 3-D standoffs |
| 550 | 3-D printed custom standoffs |
| 6xxD | referenced dimension |
| 600 | LGA or HLGA socket |
| 605 | base assembly |
| 610 | socket contact spring |
| 612 | contact beam |
| 612' | contact beam in its maximum bent position |
| 615 | mid-section |
| 620 | PCB contact end |
| 630 | hole support structure |
| 635 | hole support structure top surface |
| 640 | laminate core carrier housing, housing |
| 645 | housing top surface |
| 645A | lower housing top surface |

TABLE 2-continued

Table of Reference Numbers

| | |
|---|---|
| 645B | upper housing top surface |
| 650 | contact array through-hole aperture, through hole, via |
| 660 | pocket, drill hole |
| 670 | custom support feature; contact feature; contact downstop |
| 675 | copper layer top surface |
| 680 | copper downstop/stand-off |
| 685 | copper stop surface |
| 680 | solder mask |
| 685A | solder mask lower surface |
| 685B | solder mask upper surface |
| 690 | pocket |
| 692 | custom standoff |
| 694 | downstop |
| 695 | solder ball |
| 696 | standoff portion |

What is claimed is:

1. A method for producing a land grid array (LGA) socket connector assembly, comprising:
providing a carrier having a first carrier thickness with an array of vias, each having a first diameter;
providing pockets around top surfaces of the vias, each pocket being substantially circular, having a second diameter greater than the first diameter, and having a second carrier thickness that is less than the first carrier thickness;
providing socket contact springs, each comprising:
a hole support structure that supports the socket contact spring within a corresponding via of the array of vias; and
a contact beam configured to contact a conductor of an integrated circuit to be placed within the socket connector assembly;
wherein a portion of the carrier having the first carrier thickness is configured to prevent the contact beam from inelastically deforming when bent under load.

2. The method of claim 1, wherein providing the pockets comprises performing a second patterned controlled depth drilling operation on the carrier having the first carrier thickness to produce the pocket having the second carrier thickness.

3. The method of claim 1, wherein providing the pockets comprises:
applying a photo-imaged solder mask to a height of a first thickness on top of a laminate carrier of a second thickness.

4. The method of claim 1,
wherein the carrier comprises a molded plastic housing; and
the method further comprises:
3-D printing standoff and alignment features on a face of the socket connector assembly opposite the contact beam.

5. The method of claim 1,
wherein the carrier comprises a laminate substrate housing; and
the method further comprises:
3-D printing standoff and alignment features on a face of the socket connector assembly opposite the contact beam.

6. The method of claim 1, further comprising:
providing a board upon which the socket connector assembly will be placed;
providing a terraced standoff layer on the board to create recessed socket regions; and providing a 3-D printed standoff within the recessed socket region that supports the socket connector assembly.

7. A method for producing a land grid array (LGA) socket connector assembly, comprising:
providing a carrier having an array of vias;
providing contact features on a top surface of the carrier adjacent to corresponding vias, wherein the contact features are made by:
applying an etch mask over contact feature regions in which the contact features are located;
etching a copper layer of the carrier to remove portions of the copper layer except where the etch mask is located; and
removing the etch mask, leaving copper support features adjacent to respective via holes;
providing socket contact springs, each comprising:
a hole support structure that supports the socket contact spring within a corresponding via of the array of vias; and
a contact beam configured to contact a conductor of an integrated circuit to be placed within the socket connector assembly;
wherein the contact features are configured to have a height that prevents the contact beams from inelastically deforming when bent under load.

8. The method of claim 7, further comprising:
after the etching of the copper support features, applying a solder mask to coat the carrier top surface and etched copper support features.

9. The method of claim 7,
wherein the carrier comprises a molded plastic housing; and
the method further comprises:
3-D printing standoff and alignment features on a face of the socket connector assembly opposite the contact beam.

10. The method of claim 9, wherein material for the 3-D printing is selected from the group consisting of glass-particle-filled thermoplastics, other-particle-filled thermoplastics, curable filled epoxy materials, and polymers that contain conductive particles.

11. The method of claim 9,
wherein material for the 3-D printing is a conductive metal paste; and
the method further comprising:
bonding and sintering the 3-D printing with a laser operation.

12. The method of claim 7,
wherein the carrier comprises a laminate substrate housing; and
the method further comprises:
3-D printing standoff and alignment features on a face of the socket connector assembly opposite the contact beam.

13. The method of claim 7, wherein the contact features are 3-D printed with an X-Y-axis positional resolution down to ten microns, and Z-axis positional resolution down to fifty microns.

14. The method of claim 7, further comprising:
providing a board upon which the socket connector assembly will be placed;
providing a terraced standoff layer on the board to create recessed socket regions; and
providing a 3-D printed standoff within the recessed socket region that supports the socket connector assembly.

15. The method of claim 7,
wherein the carrier comprises a first hole and a second hole adjacent to at least one via of the array of vias, wherein a first contact feature adjacent to the at least one via extends downward from the top surface of the carrier into the first hole and extends above the top surface of the carrier;
the method further comprising:
providing a standoff that extends downward from a bottom surface of the carrier from the second hole and an alignment feature that extends above the top surface of the carrier from the second hole.

16. An assembly, comprising:
a land grid array (LGA) socket connector assembly, comprising:
a laminate carrier housing having an array of vias;
contact features on a top surface of the carrier housing adjacent to corresponding vias;
socket contact springs, each comprising:
a hole support structure that supports the socket contact spring within a corresponding via of the array of vias; and
a contact beam configured to contact a conductor of an integrated circuit to be placed within the socket connector assembly;
wherein the contact features are configured to have a height that prevents the contact beams from inelastically deforming when bent under load; wherein the carrier comprises a first hole adjacent to at least one via of the array of vias, wherein a first contact feature of the contact features adjacent to the at least one via extends downward from the top surface of the carrier into the first hole and extends above the top surface of the carrier to have the height.

17. The assembly of claim 16,
wherein the carrier housing comprises a molded plastic housing; and
the socket connector assembly further comprises:
3-D printed standoff and alignment features on a face of the socket connector assembly opposite the contact beam.

18. The assembly of claim 16, further comprising:
a printed wiring board (PWB) comprising recessed regions on its upper surface and into which the socket connector assembly is located, a bottom surface of the socket connector assembly being in contact with support structures located on a top surface of the recessed regions; and
a module that fits within a top-surface recess of the socket and has conductor contacts that are in contact with the contact beams.

19. The assembly of claim 16, wherein the carrier comprises a second hole adjacent to the at least one via of the array of vias including a standoff that extends downward from a bottom surface of the carrier from the second hole and an alignment feature that extends above the top surface of the carrier from the second hole.

20. The assembly of claim 16, wherein the first contact feature is formed within the first hole via injection molding.

* * * * *